United States Patent
Maegawa et al.

(10) Patent No.: US 8,380,452 B2
(45) Date of Patent: Feb. 19, 2013

(54) CONTROL DEVICE OF SECONDARY BATTERY AND MAP CORRECTION METHOD

(75) Inventors: Katsunori Maegawa, Toyohashi (JP); Toshiaki Nakanishi, Toyohashi (JP); Motoyoshi Okumura, Chiryu (JP)

(73) Assignee: Panasonic EV Energy Co., Ltd., Kosai-shi (JP)

( * ) Notice: Subject to any disclaimer, the term of this patent is extended or adjusted under 35 U.S.C. 154(b) by 460 days.

(21) Appl. No.: 12/732,452

(22) Filed: Mar. 26, 2010

(65) Prior Publication Data
US 2010/0250163 A1 Sep. 30, 2010

(30) Foreign Application Priority Data

Mar. 31, 2009 (JP) ................................. 2009-087094
Jul. 31, 2009 (JP) ................................. 2009-179727
Feb. 12, 2010 (JP) ................................. 2010-028661

(51) Int. Cl.
*G06F 11/30* (2006.01)
*G06F 17/40* (2006.01)
*G01R 19/00* (2006.01)

(52) U.S. Cl. ......... 702/63; 73/1.01; 73/865.8; 73/865.9; 320/134; 640/636.1; 640/636.12; 640/636.15; 640/636.19; 702/34; 702/108; 702/182; 702/187; 702/189

(58) Field of Classification Search .................. 73/1.01, 73/865.8, 865.9; 320/127, 128, 134; 324/72; 340/500, 540, 635, 636.1, 636.12, 636.15, 340/636.19; 702/1, 33, 34, 57, 60, 63, 64, 702/65, 108, 117, 127, 182, 187, 189
See application file for complete search history.

(56) References Cited

U.S. PATENT DOCUMENTS

| | | | | |
|---|---|---|---|---|
| 2,864,055 A | * | 12/1958 | Kordesch et al. | 324/427 |
| 3,258,670 A | * | 6/1966 | Piechon et al. | 320/127 |
| 3,362,217 A | * | 1/1968 | Rush et al. | 73/112.01 |
| 3,500,167 A | * | 3/1970 | Dufendach et al. | 320/132 |
| 4,258,306 A | * | 3/1981 | Bourke et al. | 320/134 |
| 4,394,741 A | * | 7/1983 | Lowndes | 340/636.13 |
| 4,677,363 A | * | 6/1987 | Kopmann | 320/131 |
| 5,119,011 A | * | 6/1992 | Lambert | 320/136 |
| 5,185,566 A | * | 2/1993 | Goedken et al. | 320/113 |
| 5,691,078 A | * | 11/1997 | Kozaki et al. | 324/428 |
| 5,903,131 A | * | 5/1999 | Sekine et al. | 320/106 |
| 5,973,497 A | * | 10/1999 | Bergk et al. | 324/428 |
| 6,114,838 A | * | 9/2000 | Brink et al. | 320/136 |
| 6,310,462 B1 | * | 10/2001 | Arai et al. | 320/132 |

(Continued)

FOREIGN PATENT DOCUMENTS

| | | | |
|---|---|---|---|
| JP | 8-222279 A | * | 8/1996 |
| JP | 2005037230 A | | 2/2005 |

(Continued)

*Primary Examiner* — Edward Cosimano
(74) *Attorney, Agent, or Firm* — Christensen O'Connor Johnson Kindness PLLC

(57) ABSTRACT

A two-dimensional map for calculating an SOC of a secondary battery is corrected. A battery ECU obtains a voltage index of a secondary battery. The voltage index is, for example, a no-load voltage of the secondary battery. When an amount of change of the calculated no-load voltage from an initial state falls outside a predefined range, the battery ECU corrects the two-dimensional map of initial state which is stored in advance in a storage unit using data obtained by statistically processing a plurality of two-dimensional maps obtained from a plurality of vehicles.

18 Claims, 20 Drawing Sheets

U.S. PATENT DOCUMENTS

| | | | |
|---|---|---|---|
| 6,924,622 B1 * | 8/2005 | Anbuky et al. | 320/132 |
| 7,676,334 B2 * | 3/2010 | Matsuura et al. | 702/63 |
| 2008/0183408 A1 * | 7/2008 | Matsuura et al. | 702/63 |
| 2010/0212184 A1 * | 8/2010 | Rudd et al. | 36/11.5 |
| 2010/0247988 A1 * | 9/2010 | Okumura et al. | 429/90 |

FOREIGN PATENT DOCUMENTS

| | | |
|---|---|---|
| JP | 2007113953 A | 5/2007 |
| JP | 2008014702 A | 1/2008 |

* cited by examiner

FIG. 12A
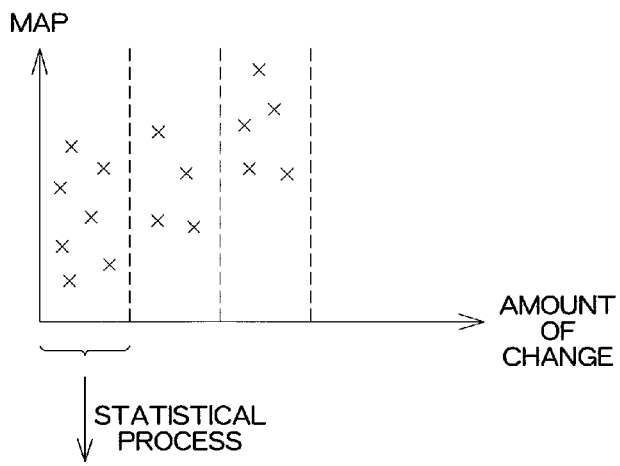
↓ STATISTICAL PROCESS
FIG. 12B
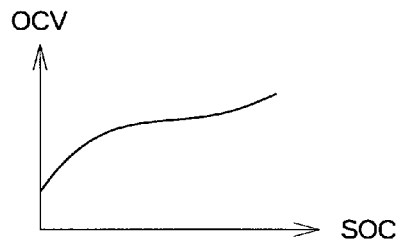
↓ CORRECTION USING RUNNING DISTANCE
FIG. 12C
FIG. 12D
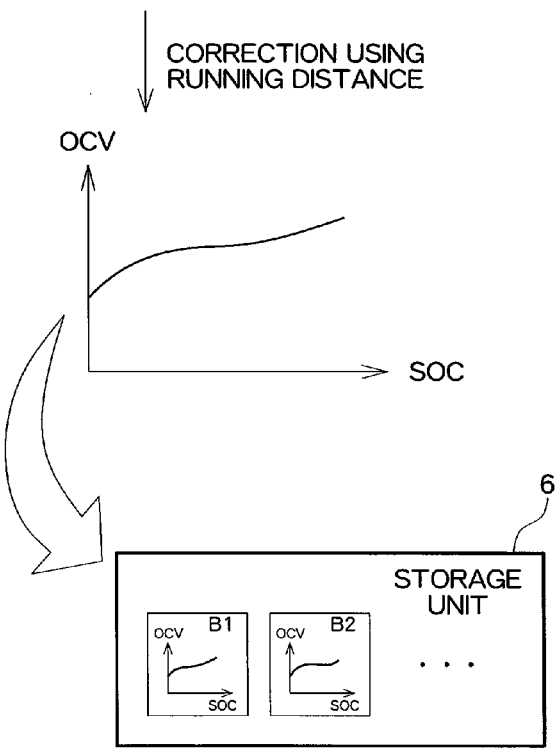

CONTROL DEVICE OF SECONDARY BATTERY AND MAP CORRECTION METHOD

PRIORITY INFORMATION

This application claims priority from Japanese Patent Application Nos. 2009-087094, filed on Mar. 31, 2009, 2009-179727, filed on Jul. 31, 2009, and 2010-028661, filed on Feb. 12, 2010, which are incorporated herein by reference in their entireties.

BACKGROUND

1. Technical Field

The present invention relates to a control device of a secondary battery, and, in particular, to a correction technique of a map (or a table) for calculating a state-of-charge (SOC) of the secondary battery.

2. Related Art

A secondary battery such as a nickel-metal hydride battery or a lithium ion battery is used as a power supply for supplying electric power to a driving motor or the like of an electric vehicle or a hybrid electric vehicle. In order to efficiently use the secondary battery, a current state of the secondary battery must be accurately evaluated.

JP 2005-37230 A discloses a technique in which an estimated charging/discharging current and a measured charging/discharging current are compared, and degradation of the secondary battery is detected based on the comparison result.

JP 2007-113953 A discloses a technique in which a voltage drop percentage during a non-usage period is calculated based on a voltage at the start of the non-usage period of the vehicle and a voltage at the end of the non-usage period, and the voltage drop percentage is compared with a reference value, to judge degradation of the secondary battery.

JP 2008-14702 A discloses a technique in which a charging/discharging current is integrated to calculate a remaining capacity based on a current integration, a remaining capacity is calculated based on an estimated value of an open voltage of the secondary battery, and a combined remaining capacity is calculated by combining the remaining capacities with certain assigned weights. Based on an amount of change of the remaining capacity based on the current integration and an amount of change of the combined remaining capacity, a current capacity change percentage is calculated, and, when the current capacity change percentage becomes less than or equal to a predetermined value, degradation of the secondary battery is determined.

In general, when a no-load voltage which is a voltage intercept when the current is zero in the secondary battery is OCV, a certain relationship exists between the no-load voltage OCV and the SOC of the secondary battery. Therefore, by storing, in a storage device in advance, a two-dimensional map which defines the relationship between the no-load voltage OCV and the SOC, calculating the no-load voltage based on a current and a voltage of the secondary battery, and referring to the two-dimensional map, a current SOC of the secondary battery can be calculated. In this specification, the no-load voltage is defined as OCV.

However, the relationship between the no-load voltage OCV and the SOC changes due to aging deterioration of the secondary battery, and, thus, a difference may arise between the SOC calculated using the two-dimensional map stored in the storage device and the actual SOC, and, if the secondary battery is controlled based on the calculated SOC, the secondary battery cannot be efficiently controlled, and, moreover, the degradation of the secondary battery may be accelerated.

SUMMARY

An advantage of the present invention is provision of a device and a method which allow calculation of the SOC of the secondary battery with high precision and efficient control of the secondary battery with the highly precisely calculated SOC.

According to one aspect of the present invention, there is provided a control device for a secondary battery, comprising a unit which obtains a voltage index of a secondary battery which is equipped as an electric power supply source, a storage unit which stores in advance a relationship between the voltage index and an SOC of the secondary battery, a unit which obtains a relationship between the voltage index and the SOC reflecting a current state of the secondary battery, and a correcting unit which corrects the relationship based on an amount of change of the obtained voltage index from an initial state, the correcting unit correcting the relationship stored in the storing unit using not only data obtained from the secondary battery, but also data obtained by statistically processing a plurality of the relationships corresponding to the amount of change among a plurality of the relationships obtained from a plurality of other secondary batteries equipped as electric power supply sources. Examples of devices to which the secondary battery is equipped include a vehicle, an uninterruptable power supply, a personal computer, etc. The voltage index is more specifically a terminal voltage, a no-load voltage, an electromotive force, etc. of the secondary battery.

According to another aspect of the present invention, preferably, in the control device for the secondary battery, degradation of the secondary battery is provisionally judged based on an internal resistance of the secondary battery calculated from a plurality of sets of pair data each consisting of a current and a voltage.

According to another aspect of the present invention, preferably, in the control device for the secondary battery, the correcting unit corrects the relationship stored in the storage unit when the calculated amount of change of the no-load voltage from the initial state falls outside a predefined range.

According to another aspect of the present invention, preferably, in the control device for the secondary battery, the secondary battery is equipped on a vehicle, and the correcting unit corrects the relationship stored in the storage unit using data obtained by statistically processing a plurality of the relationships corresponding to the amount of change and a running distance of the vehicle.

According to another aspect of the present invention, preferably, in the control device for the secondary battery, the correcting unit corrects the relationship stored in the storing unit using data obtained by statistically processing a plurality of the relationships corresponding to the amount of change and a usage period of the secondary battery from the initial state.

According to another aspect of the present invention, preferably, in the control device for the secondary battery, the secondary battery is equipped on a vehicle and the correcting unit corrects the relationship stored in the storage unit using data obtained by statistically processing a plurality of the relationships corresponding to the amount of change and a running area of the vehicle.

According to another aspect of the present invention, preferably, in the control device for the secondary battery, the secondary battery comprises a plurality of battery blocks, the storage unit stores in advance a common relationship for all battery blocks as the relationship, and the correcting unit corrects, for each block, the common relationship for all battery blocks.

According to another aspect of the present invention, preferably, in the control device for the secondary battery, the secondary battery comprises a plurality of battery modules comprising a plurality of cells, the storage unit stores in advance a common relationship for all battery modules as the relationship, and the correcting unit corrects, for each battery module, the common relationship for all battery modules.

According to another aspect of the present invention, there is provided a method of correcting a map which defines a relationship between a voltage index and an SOC of a secondary battery which is stored in advance in a storage unit for calculating the SOC of the secondary battery, the method comprising obtaining the voltage index by charging/discharging the secondary battery according to a predetermined pattern, judging whether or not an amount of change of the obtained voltage index from an initial state falls within a predefined range, and correcting, when the amount of change falls outside the predefined range, the relationship stored in the storage unit using not only data obtained from the secondary battery, but also data obtained by statistically processing a plurality of the relationships corresponding to the amount of change among a plurality of the relationships obtained from a plurality of other secondary batteries.

According to another aspect of the present invention, there is provided a control device for a secondary battery, comprising a unit which obtains a voltage index of a secondary battery which is equipped on a vehicle, a storage unit which stores in advance a relationship between the voltage index and an SOC of the secondary battery, a unit which obtains a relationship between the voltage index and the SOC reflecting a current state of the secondary battery, and a correcting unit which corrects the relationship stored in the storage unit using corresponding data, for each category of a running distance, among data obtained by statistically processing a relationship between an amount of change of the voltage index from an initial state and the SOC.

It is also preferable that, in the control device for the secondary battery, the correcting unit corrects the relationship stored in the storage unit further using corresponding data, for each category of a usage period, among data obtained by statistically processing a relationship between the amount of change and the SOC. According to another aspect of the present invention, preferably, in the control device for the secondary battery, the correcting unit further corrects the relationship stored in the storage unit using corresponding data, for each category of a running area, among data obtained by statistically processing a relationship between the amount of change and the SOC.

According to various aspects of the present invention, the relationship between the voltage index and the SOC of the secondary battery can be corrected at a suitable timing, and, thus, the SOC of the secondary battery can be calculated with high precision using the corrected relationship.

BRIEF DESCRIPTION OF THE DRAWINGS

FIGS. 12A, 12B, 12C, and 12D are conceptual explanatory diagrams of a correction process of the two-dimensional map of the no-load voltage OCV-SOC.

DETAILED DESCRIPTION

A preferred embodiment of the present invention will now be described with reference to the drawings.

Figure 1:
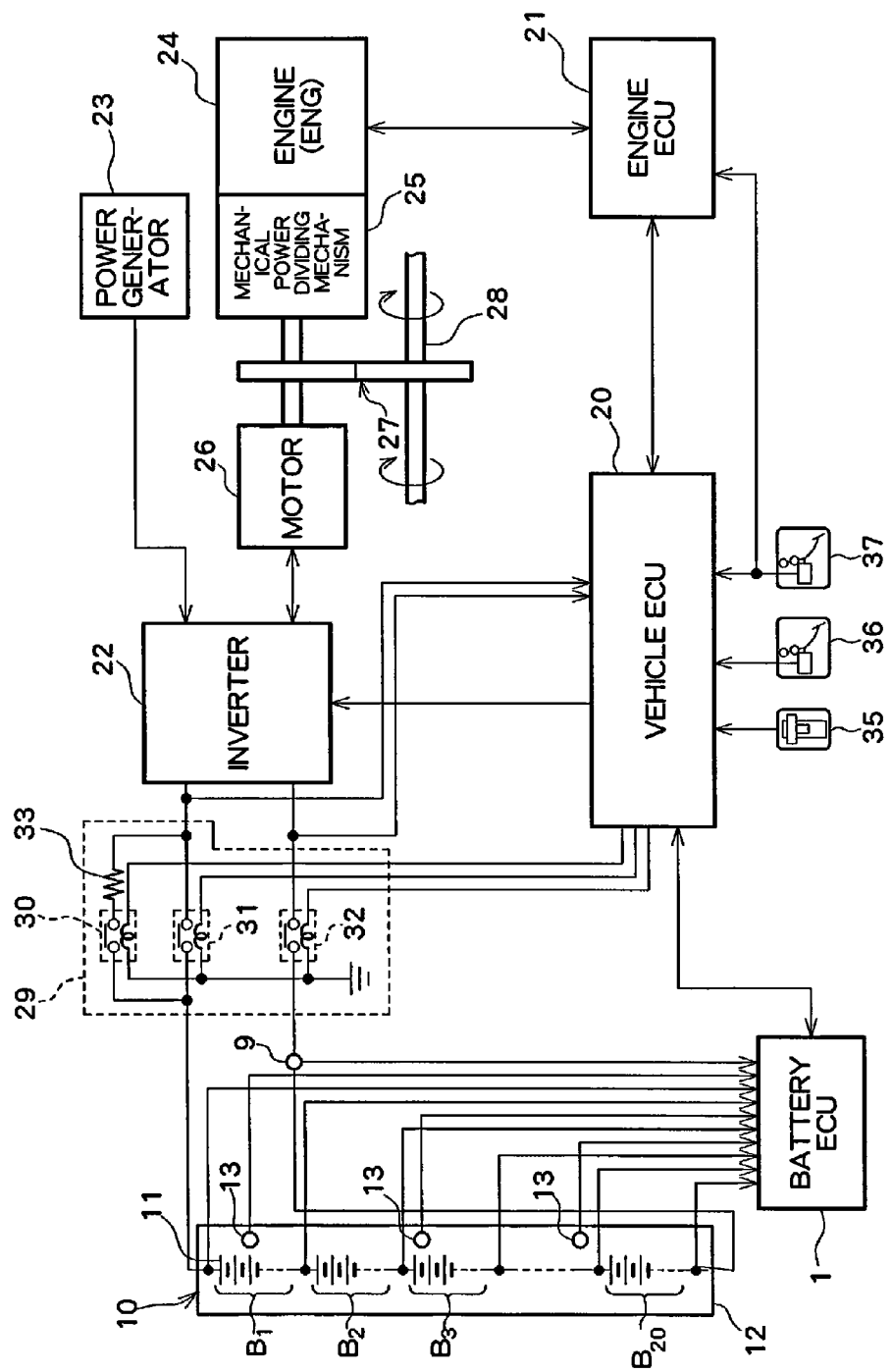
FIG. 1 is a system structure diagram of a preferred embodiment of the present invention.

FIG. 1 is a system structure diagram of a hybrid electric vehicle which is equipped with a control device of a secondary battery according to a preferred embodiment of the present invention. The hybrid electric vehicle comprises an engine 24 and a motor 26 as mechanical power sources for transferring mechanical power to a drive shaft 28. The drive shaft 28 is connected to a wheel. The hybrid electric vehicle comprises a secondary battery 10 which is equipped as an electric power supply source to the motor 26. The electric power of the secondary battery 10 is supplied via a relay unit 29 and an inverter 22 to the motor 26. The inverter 22 converts DC electric power from the secondary battery 10 into AC electric power, and supplies the converted electric power to the motor 26.

The engine 24 transfers mechanical power via a mechanical power dividing mechanism 25, a speed reducer 27, and the drive shaft 28 to the wheel. The motor 26 transfers a mechanical power via the speed reducer 27 and the drive shaft 28 to the wheel. When charging of the secondary battery 10 is necessary, a part of the mechanical power of the engine 24 is transferred via the mechanical power dividing mechanism 25 to a power generator 23.

Electric power generated by the power generator 23 is supplied via the inverter 22 and the relay unit 29 to the secondary battery 10. At the time of decelerating or braking of the hybrid electric vehicle, the motor 26 is used as a power generator (regenerative braking). The electric power generated by the motor 26 is also supplied via the inverter 22 and the relay unit 29 to the secondary battery 10.

The relay unit 29 comprises relays 30~32, and a resistor 33. The relay 31 is connected between a cathode (positive electrode) terminal of the secondary battery 10 and a high-potential input terminal of the inverter 22. The relay 32 is connected between an anode (negative electrode) terminal of the secondary battery 10 and a low-potential input terminal of the inverter 22. The relay 30 is connected in series to the resistor 33 and in parallel with the relay 31. The relay 30, along with the resistor 33, pre-charges an averaging capacitor inside the inverter 22 at startup of the vehicle.

An engine ECU 21 controls an ignition timing of the engine 24, an amount of fuel ejection, etc.

A battery ECU 1 detects a voltage, a current, and a temperature of the secondary battery 10, and estimates an SOC (State of Charge) of the secondary battery 10 based on these detected values.

A vehicle ECU 20 controls the inverter 22 and the operation of the motor 26 based on information supplied from the battery ECU 1, the engine ECU 21, etc. The information supplied from the engine ECU 21 includes, for example, an operation state of the engine 24, a rotational angle of a crank shaft, or the like. The information supplied from the battery ECU 1 includes, for example, the SOC of the secondary battery 10 or the like. An amount of operation of an acceleration pedal 37, an amount of operation of a brake pedal 36, and various information of a shift range selected by means of a shift lever 35 are also supplied to the vehicle ECU 20.

The secondary battery 10 is constructed by connecting battery blocks B1~B20 in series. The battery blocks B1~B20 are stored in a battery case 12. Each of the battery blocks B1~B20 is constructed by electrically connecting a plurality of battery modules in series, and each battery module is constructed by electrically connecting one or a plurality (for example, 6) of cells 11 in series. Each cell 11 is a nickel-metal hydride battery, and is a battery having one of capacities of the cathode and the anode greater than the other capacity at the time of design; that is, in an initial state. In the present embodiment, the cell 11 comprises a cathode which includes nickel hydroxide as a cathode active material, and an anode which includes a hydrogen absorbing alloy as an anode active material, which has a charge reserve which is an excessive capacity which is provided in advance and which is in a non-charged state when charging of the cathode is completed, and a discharge reserve which is an excessive capacity which is provided in advance and which is in a charged state when discharging of the cathode is completed, and which has a capacity greater than a theoretical capacity of the cathode. A plurality of temperature sensors 13 are placed in the battery case 12.

Figure 2:
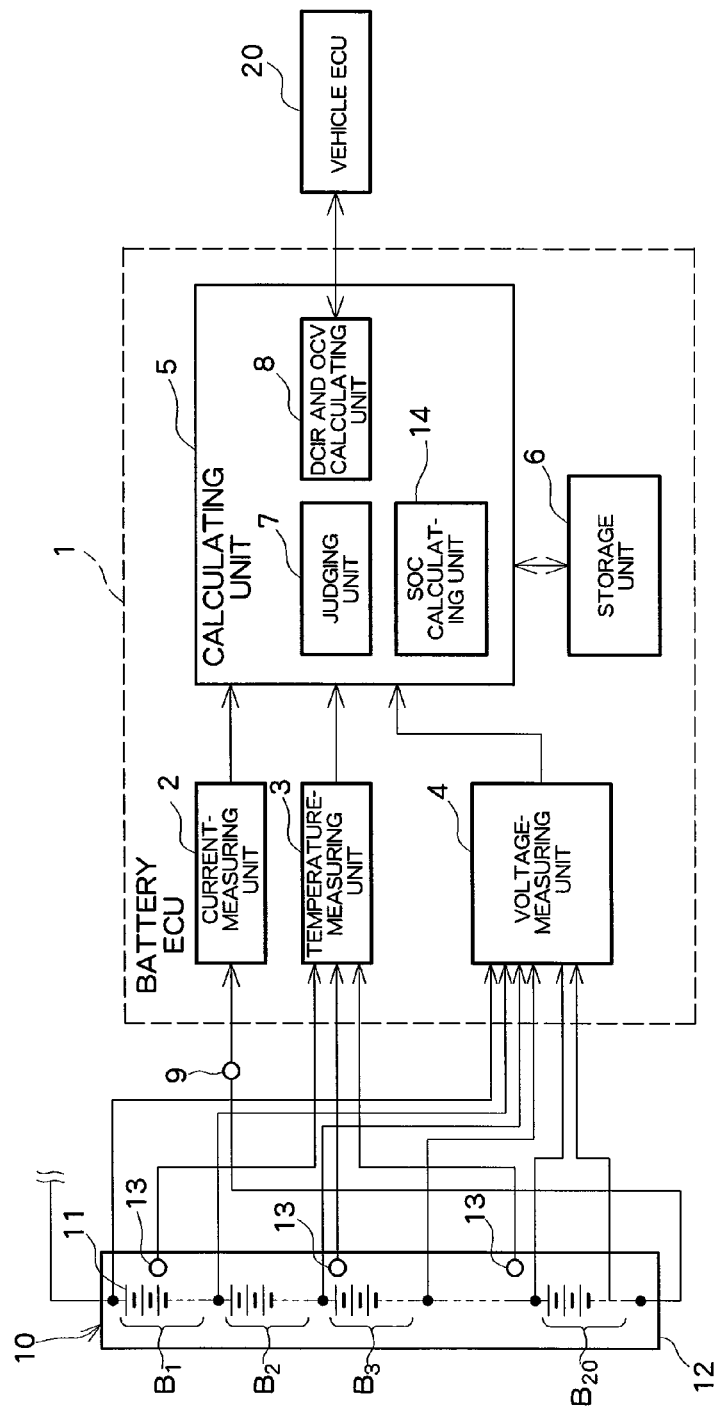
FIG. 2 is a structural diagram of a battery ECU in FIG. 1.

FIG. 2 shows a structure of the battery ECU 1 in FIG. 1. The battery ECU 1 comprises a current-measuring unit 2, a voltage-measuring unit 4, a temperature-measuring unit 3, a calculating unit 5, and a storage unit 6.

The voltage-measuring unit 4 measures the voltage of the secondary battery 10. More specifically, the voltage-measuring unit 4 measures the voltage of each of the battery blocks B1~B20. In addition, the voltage-measuring unit 4 converts the voltage for each battery block into a digital signal, and generates voltage data specifying the voltage of each battery block. The voltage-measuring unit 4 outputs the voltage data to the calculating unit 5. The output of the voltage data by the voltage-measuring unit 4 to the calculating unit 5 is periodically executed at a preset period.

The current-measuring unit 2 measures a current value I during charging/discharging of the secondary battery 10 based on a signal which is output from a current sensor 9. The current-measuring unit 2 converts an analog signal which is output by the current sensor 9 into a digital signal, and outputs the result to the calculating unit 5 as current data. The output of the current data by the current-measuring unit 2 to the calculating unit 5 is also periodically executed at a preset period. The detection timing of the voltage data and the detection timing of the current data are identical with each other.

The temperature-measuring unit 3 measures the temperature of the secondary battery 10. The temperature-measuring unit 3 converts an analog signal which is output from each temperature sensor 13 provided in each group in the battery case 12 into a digital signal, to generate temperature data, and outputs the result to the calculating unit 5.

The calculating unit 5 comprises a judging unit 7, a DCIR and OCV calculating unit 8, and an SOC calculating unit 14.

The DCIR and OCV calculating unit 8 calculates an internal resistance (DCIR) of the secondary battery 10 based on the voltage data from the voltage-measuring unit 4 and the current data from the current-measuring unit 2. More specifically, the DCIR and OCV calculating unit 8 obtains a plurality of sets of pair data consisting of a voltage value of a terminal voltage and a current value during charging/discharging for each battery block based on the voltage data from the voltage-measuring unit 4 and the current data from the current-measuring unit 2, and stores the obtained pair data in the storage unit 6. The DCIR and OCV calculating unit 8 calculates the internal resistance DCIR based on a percentage of change of the plurality of sets of pair data stored in the storage unit 6; that is, a slope of an approximated straight line of first order (V-I approximated straight line) of the plurality of sets of pair data when the current value is represented on the horizontal axis and the voltage value is represented on the vertical axis. In addition, the DCIR and OCV calculating unit 8 calculates a V intercept of the V-I approximated straight line as the no-load voltage OCV.

The SOC calculating unit 14 refers to a two-dimensional map which defines a relationship between the no-load voltage and the SOC in an initial state and which is stored in the storage unit 6 in advance, to calculate the SOC corresponding to the calculated no-load voltage OCV.

The judging unit 7 provisionally judges whether or not degradation has occurred in the secondary battery 10 based on the calculated internal resistance DCIR. In other words, the judging unit 7 judges whether or not the calculated internal resistance DCIR falls within a predetermined range with respect to a value of the initial state, and provisionally judges that degradation has occurred in the secondary battery 10 when the calculated internal resistance DCIR does not fall within the predetermined range from the initial state; that is, when an amount of change from the value of the initial state exceeds a predetermined value. Here, the provisional judgment is an indirect judgment of the degradation of the secondary battery 10 based on a physical variable of the internal resistance DCIR obtained in a running state of a hybrid electric vehicle. When it is provisionally judged that the secondary battery 10 has degraded, the judging unit 7 assumes that the two-dimensional map stored in the storage unit 6 has also been degraded; that is, the relationship between the no-load voltage OCV and the SOC has changed (degraded) from the initial state, and the two-dimensional map stored in the storage unit 6 is corrected. The judging unit 7 is also used as a unit for correcting the two-dimensional map at a repair facility, a dealer, etc.

Two-dimensional maps between the no-load voltage OCV and the SOC in the initial state and after aging deterioration will now be described.

Figure 3:
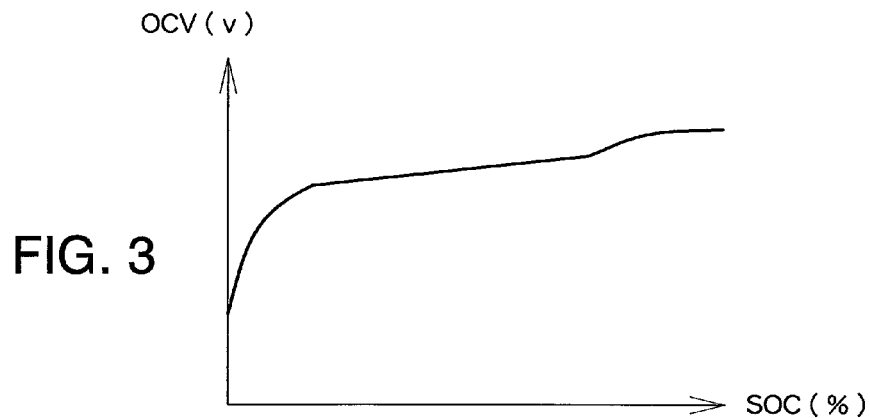
FIG. 3 is a graph showing a relationship of no-load voltage OCV-SOC in an initial state.

FIG. 3 shows a relationship between the no-load voltage OCV and the SOC in the initial state. In FIG. 3, the horizontal axis represents the SOC (%) and the vertical axis represents the no-load voltage OCV (V). The no-load voltage OCV and the SOC are in a one-to-one relationship, and, when the no-load voltage OCV is calculated, the corresponding SOC can be calculated using the two-dimensional map.

Figure 4:
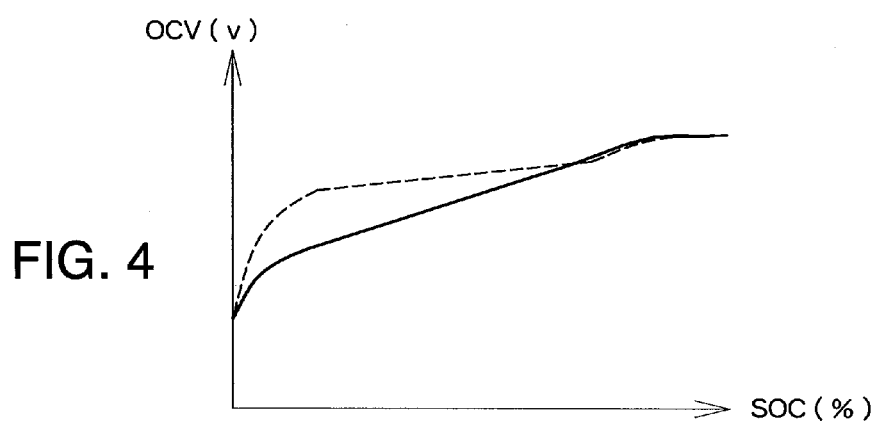
FIG. 4 is a graph showing a relationship of the no-load voltage OCV-SOC when a capacity balance between a cathode and an anode has changed.

FIG. 4 shows a relationship between the no-load voltage OCV and the SOC when the capacity balance between the cathode and the anode of the secondary battery 10 has changed due to aging deterioration. In FIG. 4, the relationship in the initial state is shown with a broken line and the relationship after the aging deterioration is shown with a solid line. In order to avoid an increase in an inner pressure of the battery in the nickel-metal hydride battery, the nickel-metal hydride battery has an anode having a charge reserve CR which is an excessive capacity provided in advance and which is in a non-charged state when charging of the cathode is completed, and a discharge reserve which is an excessive capacity provided in advance and which is in a charged state when discharging of the cathode is completed, and having a capacity greater than the theoretical capacity of the cathode, but the capacity balance may change due to the aging deterioration. In this case, the relationship between the no-load voltage OCV and the SOC is also changed, and the relationship changes from the relationship shown with the broken line to the relationship shown with the solid line. In other words, the relationship between the no-load voltage OCV and the SOC is changed particularly in a low SOC region to a middle SOC region, and, a given no-load voltage OCV would correspond to a higher SOC.

Figure 5:
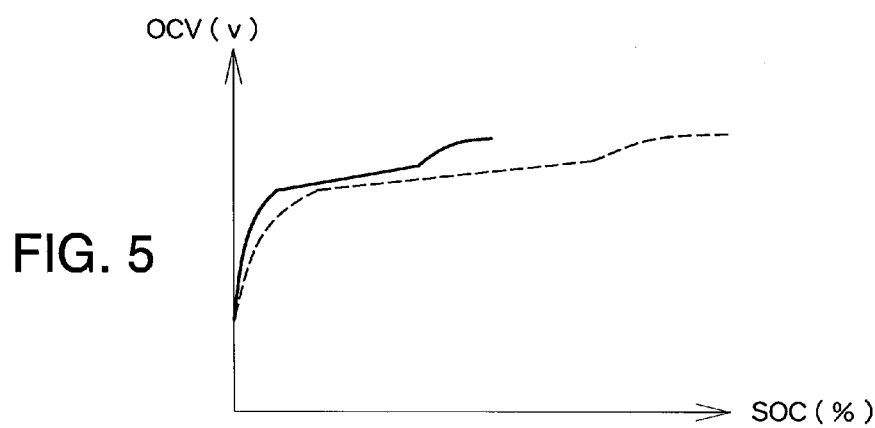
FIG. 5 is a graph showing a relationship of the no-load voltage OCV-SOC when the capacity is reduced.

FIG. 5 shows a relationship between the no-load voltage OCV and the SOC when the capacity of the secondary battery 10 is reduced due to the aging deterioration. In FIG. 5, a relationship in the initial state is shown with a broken line and a relationship after the aging deterioration is shown with a solid line. When the capacity is reduced, the relationship between the no-load voltage OCV and the SOC is also changed, and the relationship changes from the relationship shown with the broken line to the relationship shown with the solid line. In other words, a given no-load voltage OCV would correspond to a lower SOC. In addition, a high SOC region would disappear.

Figure 6:
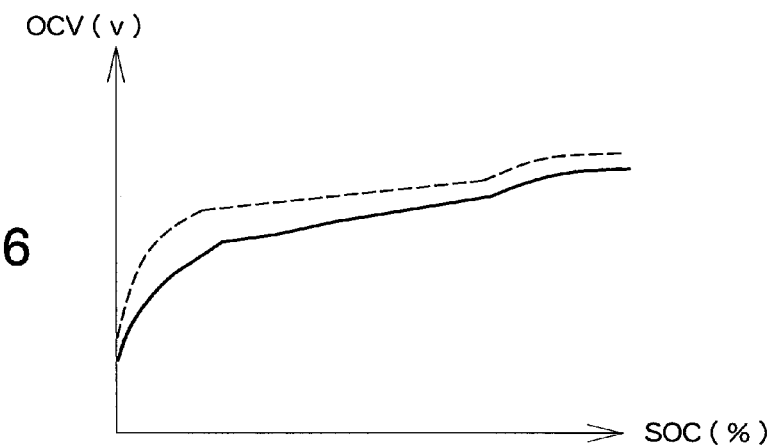
FIG. 6 is a graph showing a relationship of the no-load voltage OCV-SOC when a direct current internal resistance (DCIR) is increased.

FIG. 6 shows a relationship between the no-load voltage OCV and the SOC when the internal resistance DCIR of the secondary battery 10 is increased due to the aging deterioration. In FIG. 6, a relationship in the initial state is shown with a broken line, and a relationship after the aging deterioration is shown with a solid line. When the internal resistance DCIR is increased, the relationship between the no-load voltage OCV and the SOC is also changed, and the relationship changes from the relationship shown with the broken line to the relationship shown with the solid line. In other words, a given no-load voltage OCV would correspond to a higher SOC.

Figure 7:
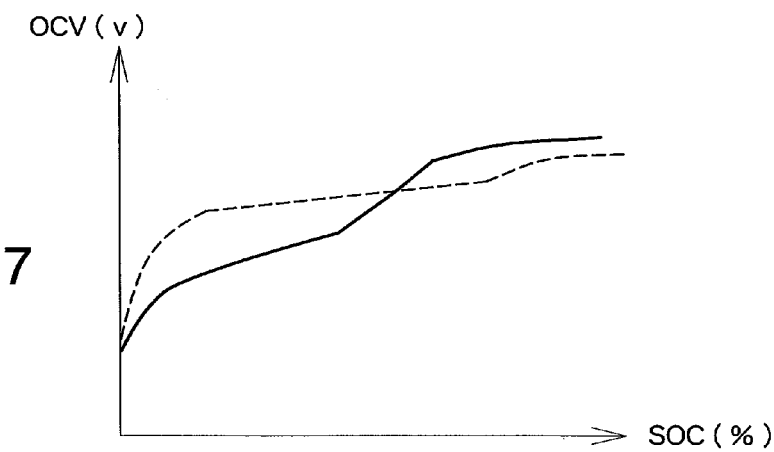
FIG. 7 is a graph showing a relationship of the no-load voltage OCV-SOC when a memory effect is formed.

FIG. 7 shows a relationship between the no-load voltage OCV and the SOC when a memory effect occurs in the secondary battery 10 due to the aging deterioration. In FIG. 7, a relationship in the initial state is shown with a broken line and a relationship after the aging deterioration is shown with a solid line. In the low SOC region to the middle SOC region, a given no-load voltage OCV would correspond to a higher SOC, and, in the middle SOC region to the high SOC region, a given no-load voltage OCV would correspond to a lower SOC.

As described, when the secondary battery 10 is deteriorated with time, the relationship between the no-load voltage OCV and the SOC would change due to a change of the capacity balance, reduction of the capacity, increase of the internal resistance DCIR, memory effect, etc. Therefore, if the SOC is calculated based on the relationship between the no-load voltage OCV and the SOC in the initial state, there is a possibility that an erroneous SOC is calculated.

Figure 8:
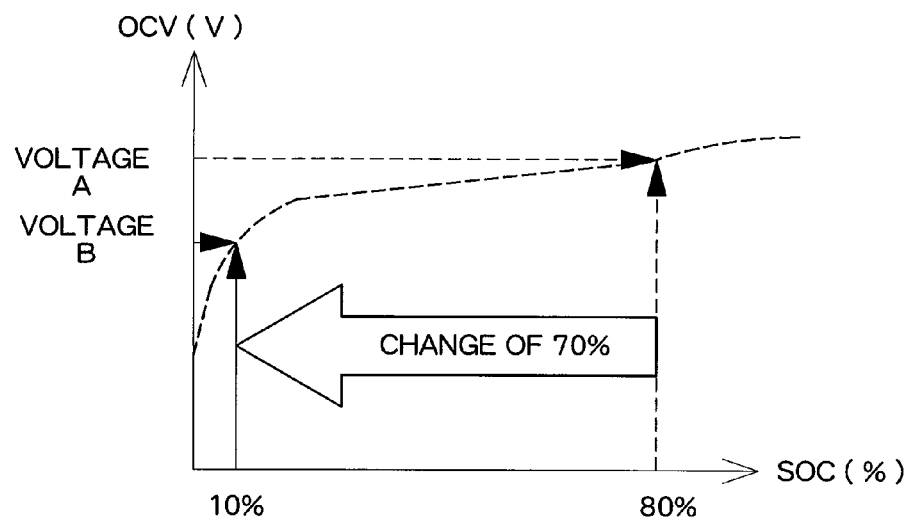
FIG. 8 is an explanatory diagram of the SOC calculated using a map in an initial state.
Figure 9:
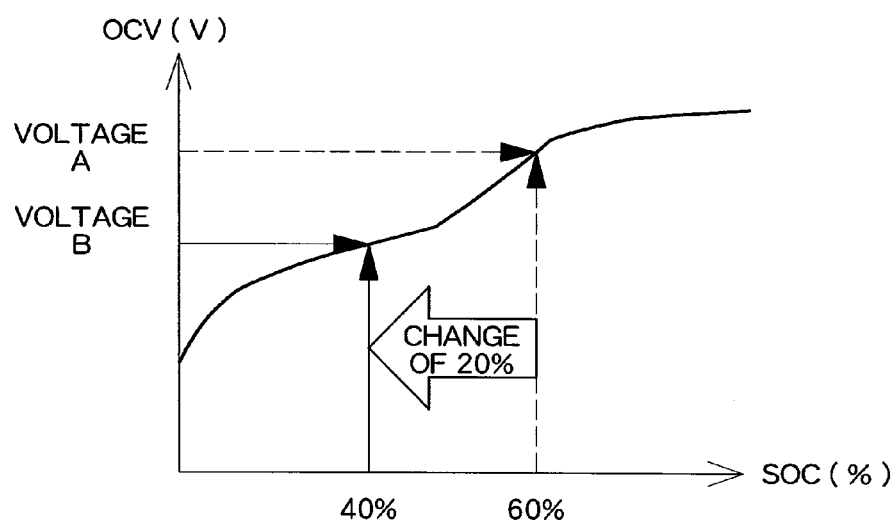
FIG. 9 is an explanatory diagram of the SOC calculated using a corrected map.

FIGS. 8 and 9 show an example of SOC calculation. In the initial state, the relationship between the no-load voltage OCV and the SOC is a relationship as shown in FIG. 8, and the relationship changes to a relationship as shown in FIG. 9 due to the aging deterioration. Meanwhile, the storage unit 6 stores the two-dimensional map in the initial state as shown in FIG. 8. Therefore, if the two-dimensional map is used, the SOC is calculated as 80% when the no-load voltage OCV is a voltage A, the SOC is calculated as 10% when the no-load voltage OCV is a voltage B, and a net change of the SOC is calculated as 70%. However, in reality, the relationship has changed as shown in FIG. 9, and in reality the SOC corresponding to the voltage A is 60% and the SOC corresponding to the voltage B is 40%. Thus, the net amount of change of the SOC is only 20%. When there is a difference between the SOC calculated by the calculating unit 5 and the actual SOC as in this case, the performance of the secondary battery 10 cannot be sufficiently realized, and the lifetime of the secondary battery 10 is reduced due to excessive discharging, excessive charging, etc. In consideration of this, the judging unit 7 of the present embodiment provisionally judges the degradation of the secondary battery 10, and, when the judging unit 7 provisionally judges that the secondary battery 10 has degraded, it is assumed that the two-dimensional map stored in the storage unit 6 has also changed, and the two-dimensional map is corrected, so that the actual relationship between the no-load voltage OCV and the SOC is reflected. The correction of the two-dimensional map is executed based on an amount of change of the actual no-load voltage with respect to the no-load voltage in the initial state, and the two-dimensional map is corrected using not only the data of the vehicle on which the secondary battery 10 is equipped, but also statistical data obtained from a plurality of other vehicles.

Figure 10:
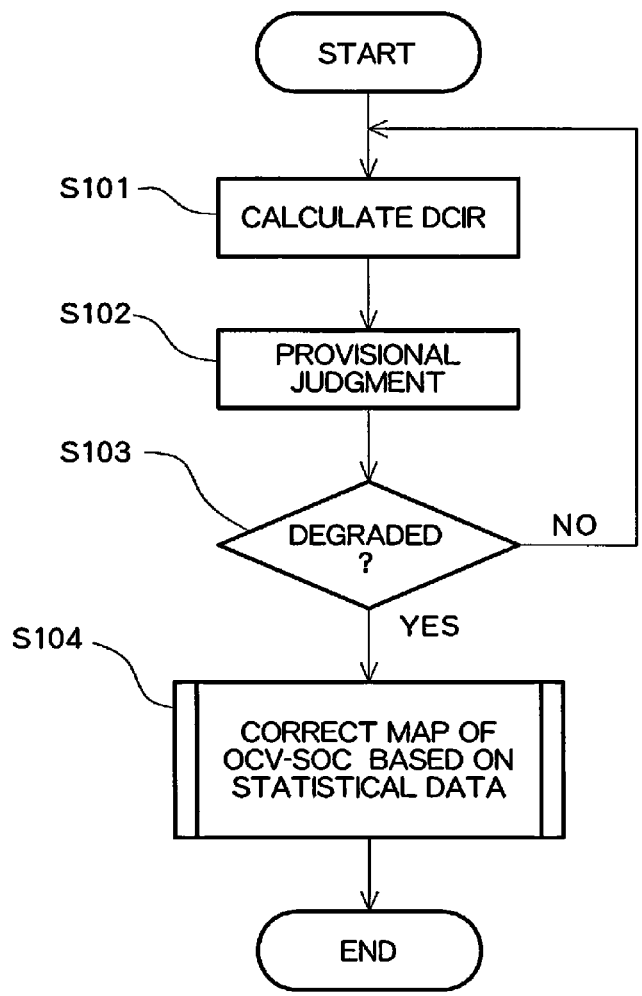
FIG. 10 is a process flowchart of a preferred embodiment of the present invention.

FIG. 10 shows a process flowchart of the present embodiment. First, the DCIR and OCV calculating unit 8 calculates an internal resistance DCIR for each block of the secondary battery 10 based on a plurality of sets of pair data of the current and the voltage (S101). As described above, the internal resistance DCIR is calculated as the slope of an approximated straight line. The calculated internal resistance DCIR is supplied to the judging unit 7. The judging unit 7 compares the magnitude of the internal resistance DCIR with a predefined upper limit value $\alpha$ and a predefined lower limit value $\beta$, and judges whether or not $\alpha >$(calculated internal resistance DCIR)$>\beta$(S102). When the condition of $\alpha >$(calculated internal resistance DCIR)$>\beta$ is not satisfied; that is, when $\alpha \leqq$(calculated internal resistance DCIR) or $\beta \geqq$(calculated internal resistance DCIR), the judging unit 7 provisionally judges that the secondary battery 10 has degraded. The provisional judgment is executed by the judging unit 7 during running of the vehicle. The secondary battery 10 is judged degraded (YES in S103) or not degraded (NO in S103). When it is judged that the secondary battery 10 is degraded (YES in S103), the two-dimensional map of OCV-SOC in the initial state stored in the storage unit 6 is corrected using statistical data obtained from two-dimensional maps of OCV-SOC of a plurality of vehicles (S104). By correcting the two-dimensional map when it is provisionally judged that the secondary battery 10 is degraded, the two-dimensional map can be updated to a two-dimensional map reflecting the current state of the secondary battery 10. Therefore, after this process, it becomes possible to more accurately calculate the SOC of the secondary battery 10. The correction of the two-dimensional map is more specifically executed at a repair facility, a dealer, etc.

Figure 11:
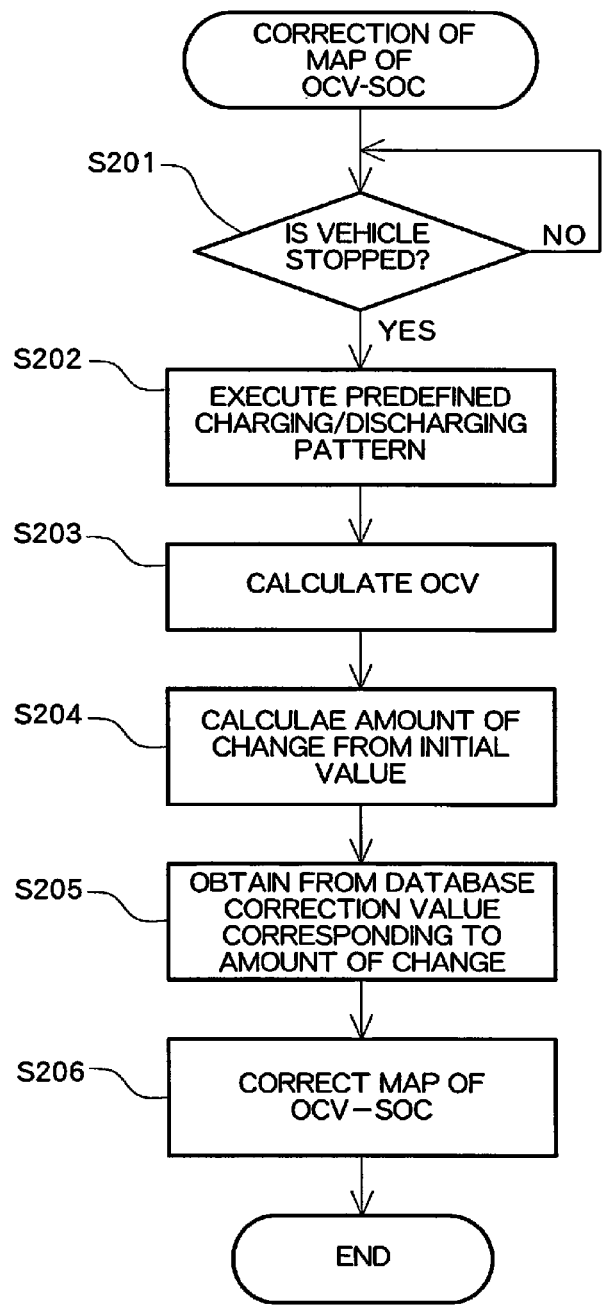
FIG. 11 is a detailed flowchart of a correction process of a two-dimensional map of the no-load voltage OCV-SOC in FIG. 10.

FIG. 11 shows a detailed flowchart of the correction process (S104) of the two-dimensional map of OCV-SOC in FIG. 10. As described above, the correction process (S104) of the two-dimensional map is executed at a repair facility of the vehicle, a dealer, etc. A charging/discharging device is connected to the secondary battery 10 for separate charging/discharging processes, and data such as the voltage and the current in this process can be obtained by the battery ECU 1. First, it is judged whether the vehicle is in a stopped state (YES in S201) or in a not stopped state (NO in S201). In the stopped state, the current capacity of the secondary battery is checked. In order to do so, a cycle of charging/discharging is executed at a constant current of, for example, 0.3C, the cycle consisting of a complete discharge, a full charge, and a complete discharge. Then, the secondary battery 10 is charged/discharged with a predefined charging/discharging pattern (S202). The predefined charging/discharging pattern is, for example, a pattern in which the battery is charged to an SOC of 80%, and left for a predetermined time period. Then, under a constant temperature environment of 25° C., 5 cycles of a charging/discharging cycle in which "the battery is discharged for 5 seconds with a predetermined current value, left for 60 seconds, charged for 5 seconds with a predetermined current value, and left for 60 seconds" are executed. In the present embodiment, the predetermined current value is changed for each cycle in the order of 1C, 2C, 5C, 10C, and 15C, and the charging/discharging process is executed for 5 cycles. In each charging/discharging cycle, a terminal voltage of each battery block immediately after the charging for 5 seconds is measured. The measured values are plotted in a graph representing the current value on the horizontal axis and the terminal voltage of the battery block on the vertical axis. Then, using a method of least squares, the internal resistance DCIR is calculated from a slope of a straight line corresponding to the plotted data and the V intercept when the current is zero is calculated as the no-load voltage OCV. The SOC is then stepwise reduced to 20%, and, at the SOC of each step, the internal resistance DCIR and the no-load voltage OCV are calculated in a manner similar to the above-described case of the SOC of 80% (S203). In other words, a two-dimensional map of OCV-SOC reflecting the current state of the secondary battery is calculated.

Next, an amount of change of the current no-load voltage calculated in S203 with respect to the initial value of the no-load voltage of the secondary battery 10 stored in the storage unit 6 in advance is calculated (S204). The amount of change of the current no-load voltage with respect to the initial value can be calculated for all SOCs of the map, and, in the present embodiment, for example, the amount of change of the no-load voltage at the SOC of 50% is calculated. The amount of change may be a difference value between the current no-load voltage and the initial value or a ratio between the current no-load voltage and the initial value (percentage of change). After the amount of change is calculated, a correction value corresponding to the amount of change is obtained from a database (S205). The database stores data obtained by statistically processing two-dimensional maps of OCV-SOC of a plurality of vehicles, and statistical processing data matching the calculated amount of change are obtained. Then, the two-dimensional map of OCV-SOC stored in the storage unit 6 is corrected using the data obtained from the database (S206).

Because the amount of change of the no-load voltage is calculated for each of the battery blocks B1~B20 which are a part of the secondary battery 10, the correction of the two-dimensional map of OCV-SOC is also executed for each battery block. That is, as the storage unit 6 stores at the initial state a two-dimensional map of OCV-SOC common to all battery blocks, the two-dimensional map of OCV-SOC is corrected for each battery block. The two-dimensional map of OCV-SOC after the correction is stored in the storage unit 6 for each block. For example, a corrected two-dimensional map A of OCV-SOC is stored for the block B1, a corrected two-dimensional map B of OCV-SOC is stored for the block B2, a corrected two-dimensional map C of OCV-SOC is stored for the block B3, etc. When the two-dimensional map of OCV-SOC is to be corrected, it is preferable to apply the correction after finely correcting (customizing) data obtained from the database, according to a running distance of the vehicle on which the secondary battery 10 is equipped.

FIGS. 12A, 12B, 12C, and 12D are conceptual diagrams of correction of the two-dimensional map of OCV-SOC. As shown in FIG. 12A, two-dimensional maps of OCV-SOC obtained from a plurality of vehicles are collected, categorized for each amount of change from the initial value, and stored in the database. In FIG. 12A, an "X" mark represents an OCV-SOC map obtained from one vehicle. The map represents a characteristic of a particular map shown in FIGS. 3-7 showing general aging degradation or a characteristic of a combination of these maps. In the database, a statistical process; for example, an averaging process, is applied to the plurality of maps categorized for each amount of change, and a statistical OCV-SOC map is calculated and stored for each category of the amount of change. FIG. 12B shows an example of the two-dimensional map of OCV-SOC obtained by statistically processing a plurality of maps having the amount of change belonging to a certain category.

After the statistical two-dimensional map of OCV-SOC corresponding to the amount of change is obtained, when the two-dimensional map of OCV-SOC stored in the storage unit 6 is corrected using the statistical two-dimensional map of OCV-SOC, the statistical two-dimensional map of OCV-SOC is finely corrected according to a running distance of the vehicle, as shown in FIG. 12C. For example, an average running distance of the statistical two-dimensional map of OCV-SOC is compared with the running distance of the vehicle on which the secondary battery 10 and the storage unit 6 are equipped, and, when the difference is greater than or equal to a predetermined distance, the statistical two-dimensional map of OCV-SOC is further corrected in a reducing direction, as shown in FIG. 6. As shown in FIG. 12D, the statistical two-dimensional map of OCV-SOC which is finely corrected based on the running distance is stored in the storage unit 6, and the two-dimensional map of OCV-SOC in the initial state which is stored in advance is replaced and corrected (updated). As described above, because the correction is executed in units of the battery blocks, the storage unit 6 stores two-dimensional maps for battery blocks B1, B2, . . . .

Alternatively, in place of finely correcting the statistical two-dimensional map of OCV-SOC according to the running distance, it is also possible to use the running distance when extracting the sample data for statistical processing. In other words, a map of a vehicle having a closer running distance may be extracted from among the plurality of maps belonging to each category of the amount of change as shown in FIG. 12A, and a statistical process may be applied to the extracted map. The maps of FIG. 12A are obtained from a plurality of vehicles, and the running distances of the vehicles are known. Therefore, the running distance of the vehicle on which the secondary battery 10 and the storage unit 6 are equipped (the vehicle in which the two-dimensional map is to be updated) and the running distances of the maps stored in the database are compared, and only the maps which are judged as having a difference of the running distance less than a predefined distance and as being close in running distance are extracted from the statistical population, and a statistical process (for example, an averaging process) is applied, to produce a statistical two-dimensional map of OCV-SOC. Because the statistical two-dimensional map of OCV-SOC produced in this manner is a two-dimensional map which takes into consideration the running distance, the statistical two-dimensional map is stored in the storage unit 6 without further processing, and the two-dimensional map is updated.

Figure 13A:
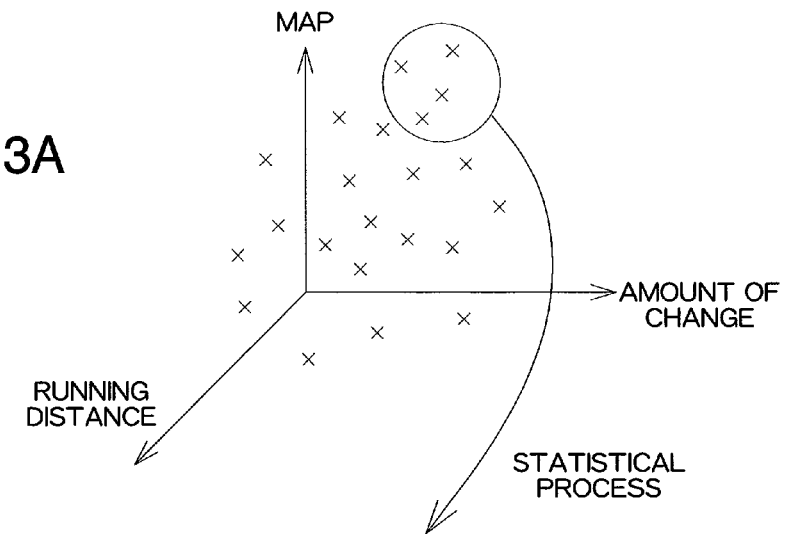
FIGS. 13A, 13B, and 13C are other conceptual explanatory diagrams of a correction process of the two-dimensional map of the no-load voltage OCV-SOC.
Figure 13B:
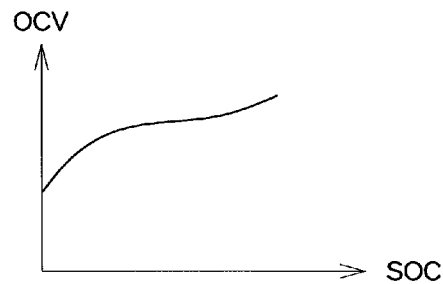
Figure 13C:
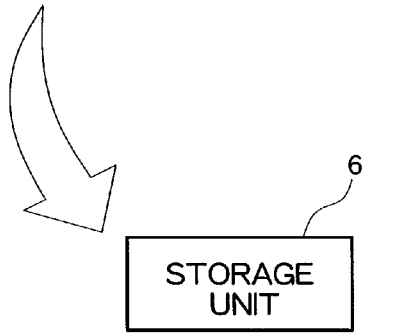

FIGS. 13A, 13B, and 13C are conceptual diagrams of this process. As shown in FIG. 13A, the database stores the two-dimensional maps of OCV-SOC obtained from a plurality of vehicles, categorized by the amount of change and the running distance. In FIG. 13A, an "X" mark represents an OCV-SOC map obtained from one vehicle. The map shows a characteristic of a particular map shown in FIGS. 3-7 after a general aging deterioration or a combination of these maps. From among these plurality of two-dimensional maps, two-dimensional maps having the amount of change and the running distance which match or which are close to the amount of change and the running distance of the vehicle on which the secondary battery 10 and the storage unit 6 are equipped are extracted, and a statistical process (for example, an averaging process) is applied to the extracted two-dimensional maps, to produce a statistical two-dimensional map of OCV-SOC. FIG. 13B shows a produced statistical two-dimensional map of OCV-SOC. The statistical two-dimensional map of OCV-SOC is stored in the storage unit 6, to update the two-dimensional map.

As described, by correcting (updating) the two-dimensional map stored in the storage unit 6 using the two-dimensional map obtained by statistically processing the two-dimensional maps obtained from a plurality of vehicles, and calculating the SOC using the corrected two-dimensional map, the SOC can be calculated with higher precision. Therefore, the secondary battery 10 can be efficiently controlled based on the accurately calculated SOC, and excessive discharging and excessive charging can be prevented. Because of this, a secondary battery having a certain degree of aging deterioration can be safely used.

In the present embodiment, the two-dimensional map is corrected in consideration of the running distance. Alternatively, it is also possible to consider, in addition to the running distance, the usage period of the secondary battery 10 or a running area, a running frequency, and a usage environment of the vehicle on which the secondary battery 10 is equipped. The usage period of the secondary battery 10 can be calculated from the date when the secondary battery 10 is equipped (or the date when the secondary battery 10 is manufactured) and the current date. The running area can be determined from running history data of a navigation system equipped in the vehicle. The running area is, for example, a city, a suburb, a flat road, a mountain road, a highway, etc. Alternatively, an average vehicle velocity, or variables which determine the acceleration work such as a road inclination, a distance between signal lights, a number of lanes, a congestion situation, etc. may be considered. The two-dimensional map is corrected (updated) by extracting the two-dimensional maps having the amount of change of the no-load voltage OCV matching or being close to each other and having the running distance, the usage period, or the running area matching or being close to each other, applying the statistical process, and storing the obtained statistical two-dimensional map in the storage unit 6. Examples of possible combinations include: only the amount of change; the amount of change and the running distance; the amount of change and the usage period; the amount of change and the running area; the amount of change, the running distance, and the usage period; the amount of change, the running distance, and the running area; the amount of change, the usage period, and the running area; and the amount of change, the running distance, the usage period, and the running area.

In addition, in the present embodiment, the two-dimensional map stored in the storage unit 6 is corrected using the two-dimensional map obtained by statistically processing two-dimensional maps obtained from a plurality of vehicles. Alternatively, it is also possible to categorize the amount of change of the OCV for each running distance, each usage period, each running area, etc., apply the statistical process, and correct the two-dimensional map based on the obtained amount of change of the OCV. In this case, the statistically processed amount of change of the OCV is stored in the database categorized for each running distance and each usage period, and a two-dimensional map matching the running distance, usage period, or the like of the vehicle to be corrected may be extracted.

Figure 14:
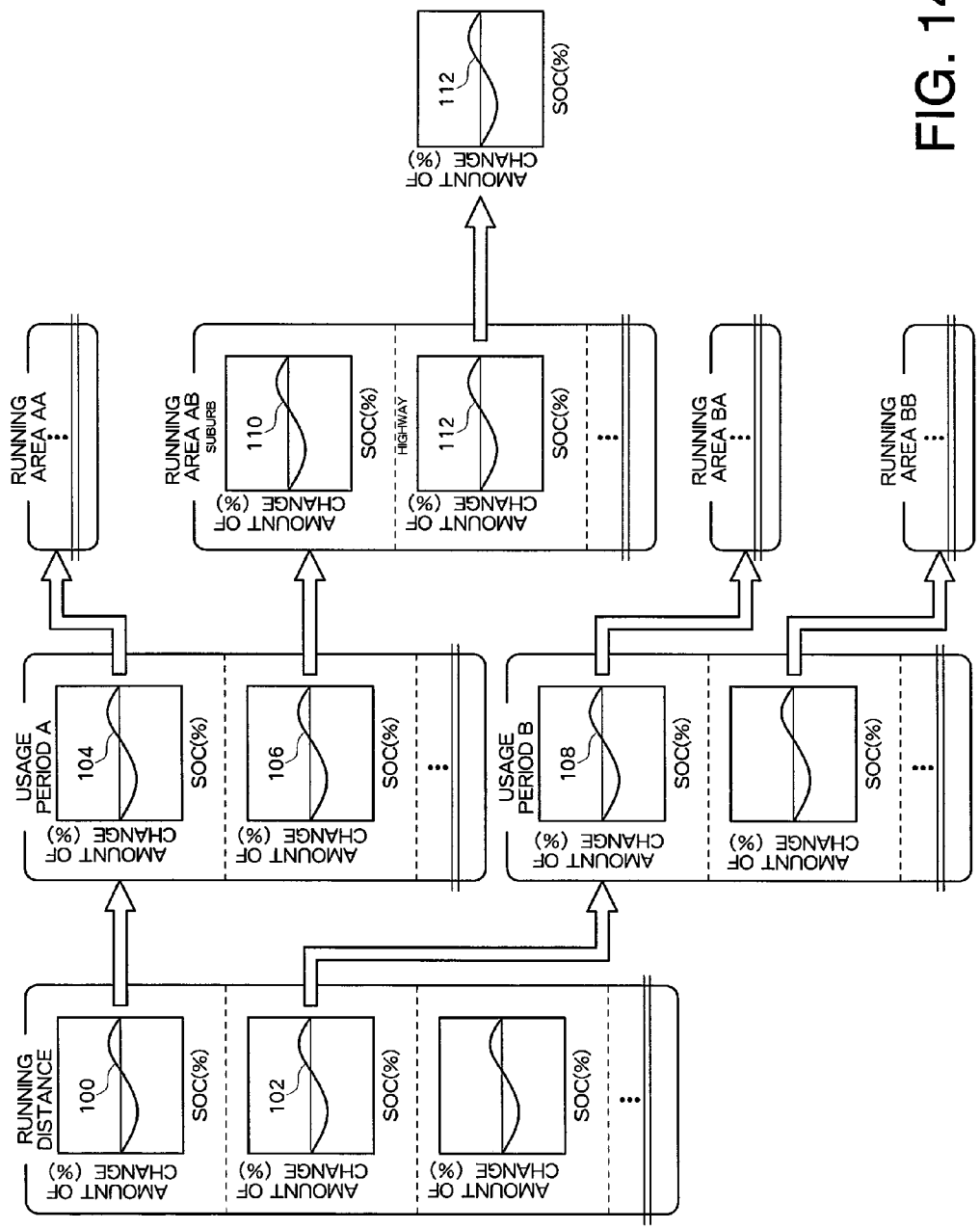
FIG. 14 is a schematic diagram of a database of a preferred embodiment of the present invention.
Figure 15:
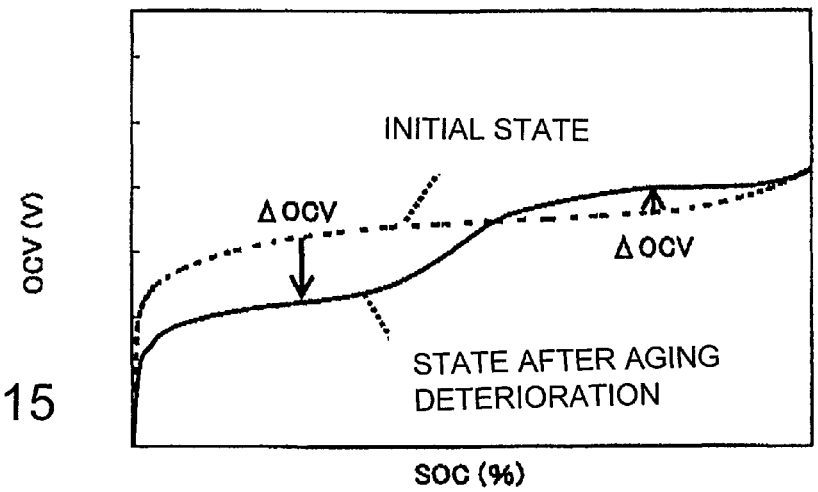
FIG. 15 is an explanatory diagram showing a relationship between the SOC and the no-load voltage OCV of a certain vehicle.
Figure 16:
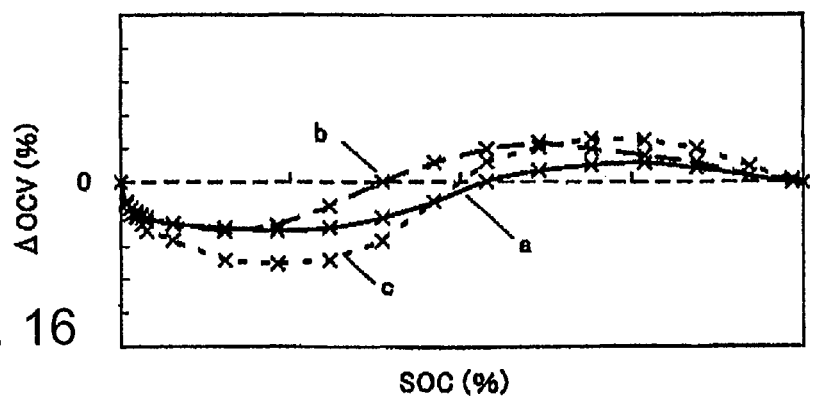
FIG. 16 is an explanatory diagram of ΔOCV in a plurality of vehicles.
Figure 17:
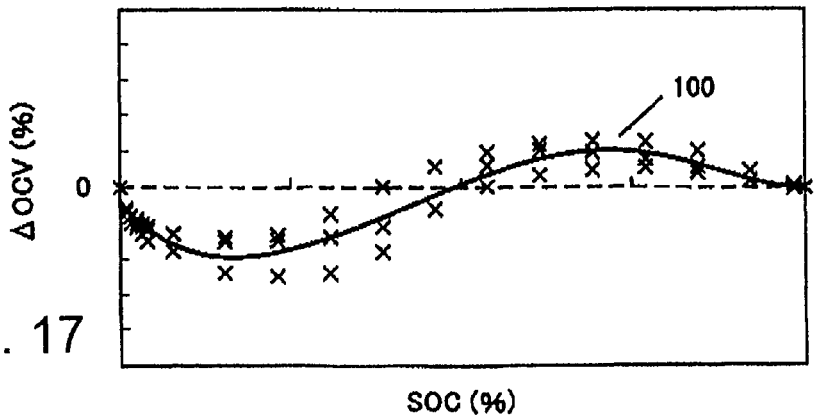
FIG. 17 is an explanatory diagram of ΔOCV obtained by statistically processing data of FIG. 16.
Figure 18:
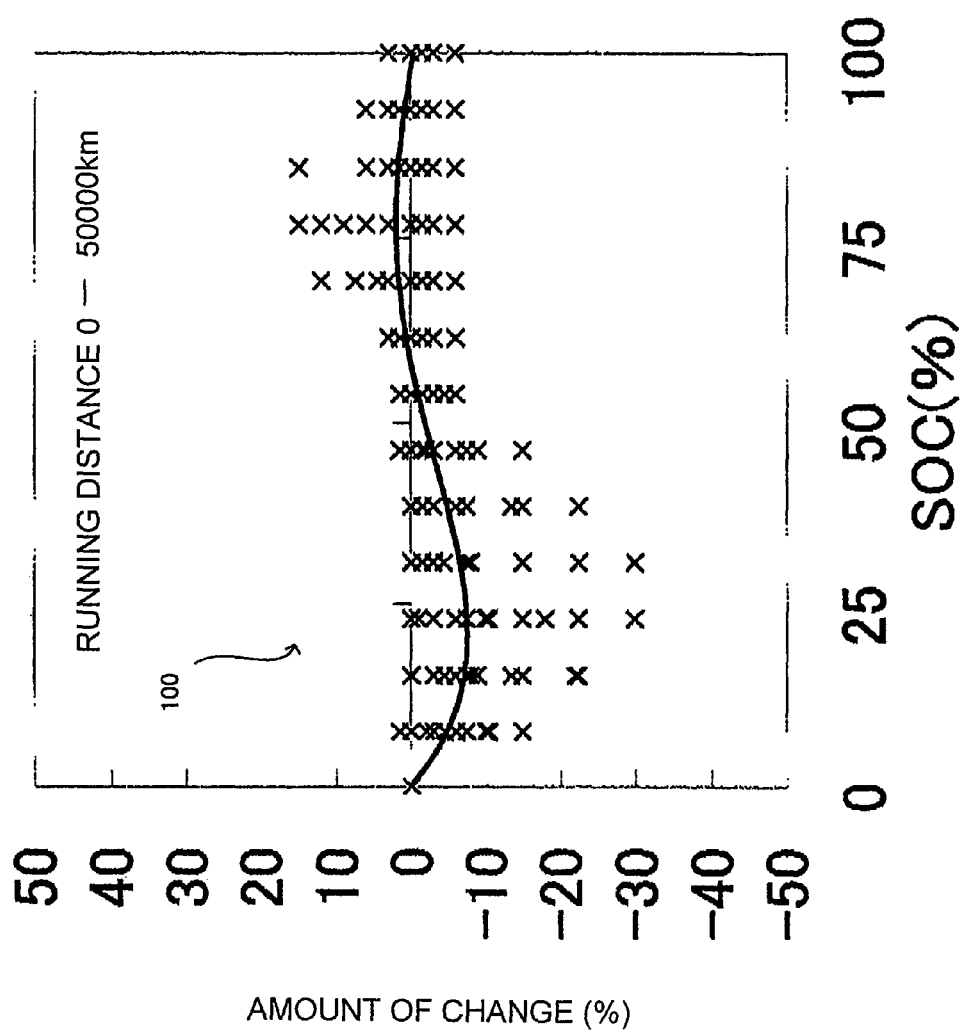
FIG. 18 is a detailed graph (running distance) of FIG. 14.
Figure 19:
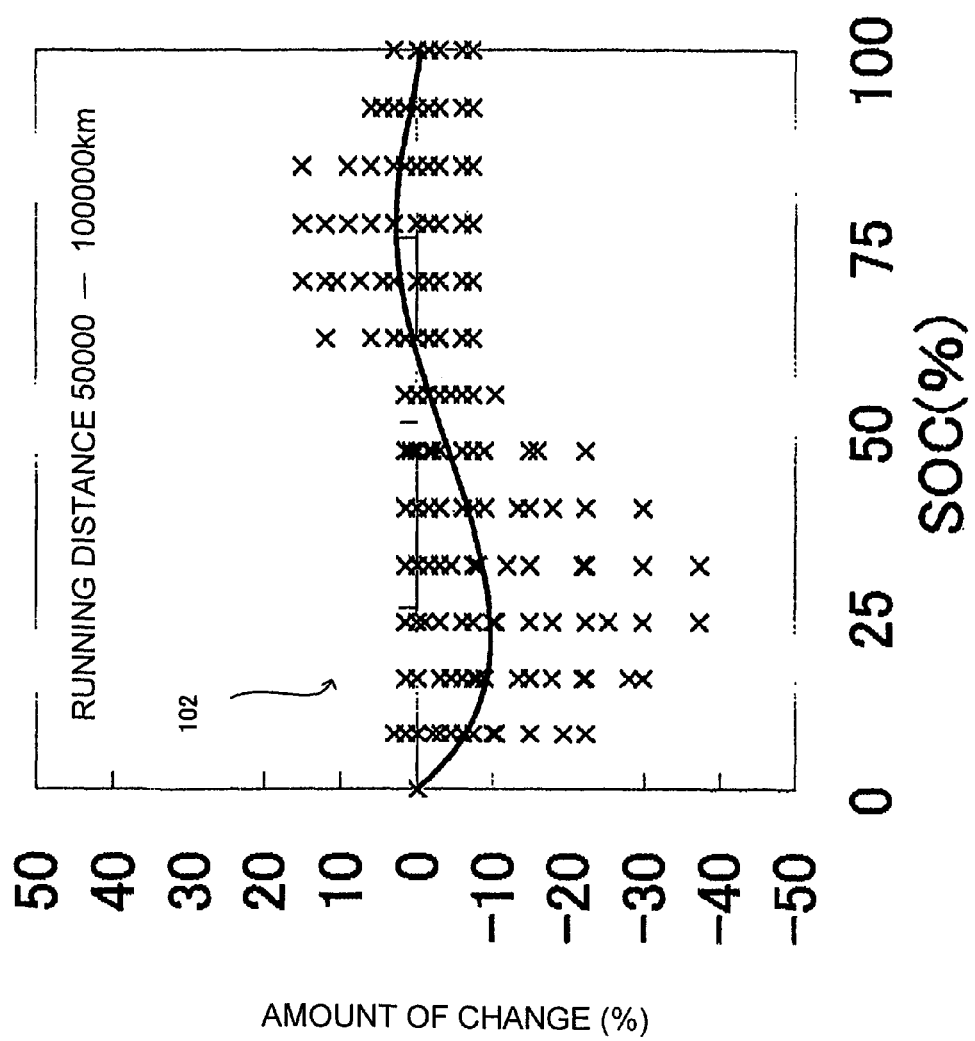
FIG. 19 is a detailed graph (running distance) of FIG. 14.
Figure 20:
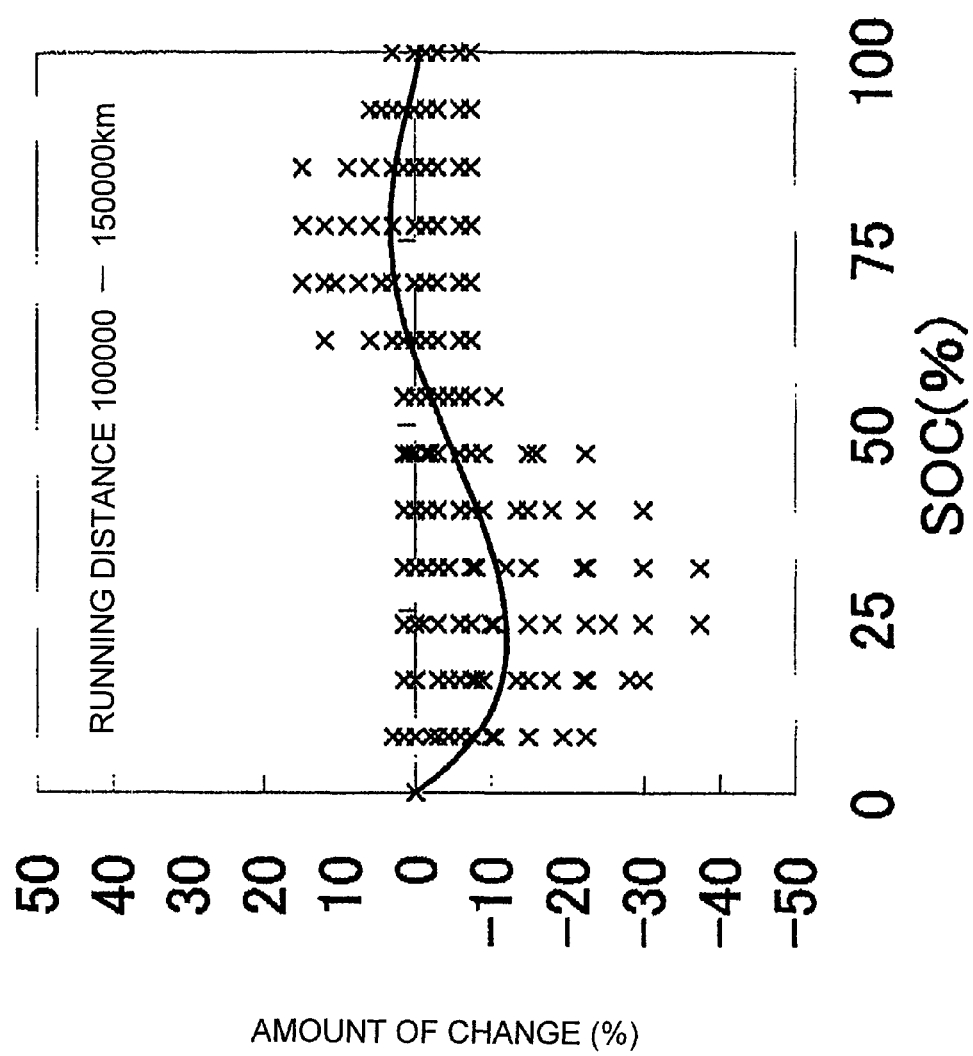
FIG. 20 is a detailed graph (running distance) of FIG. 14.
Figure 21:
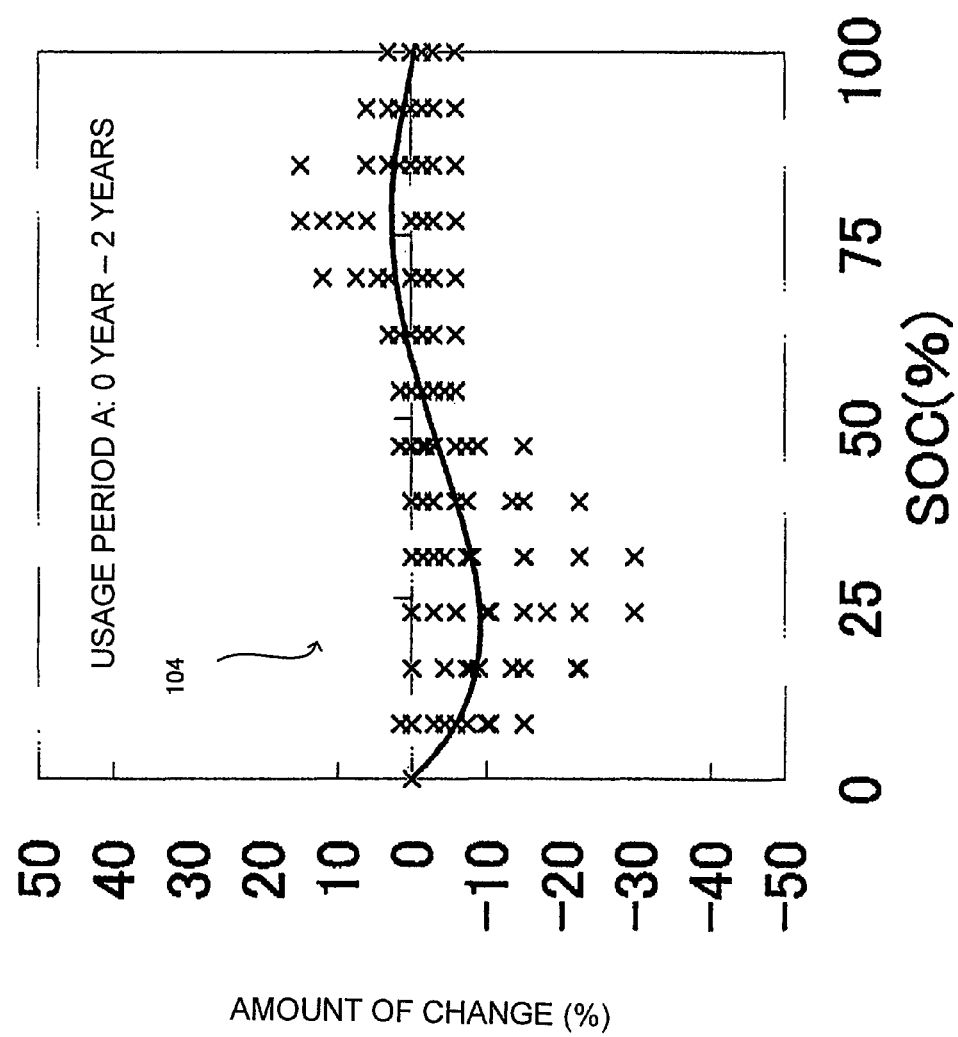
FIG. 21 is a detailed graph (usage period) of FIG. 14.
Figure 22:
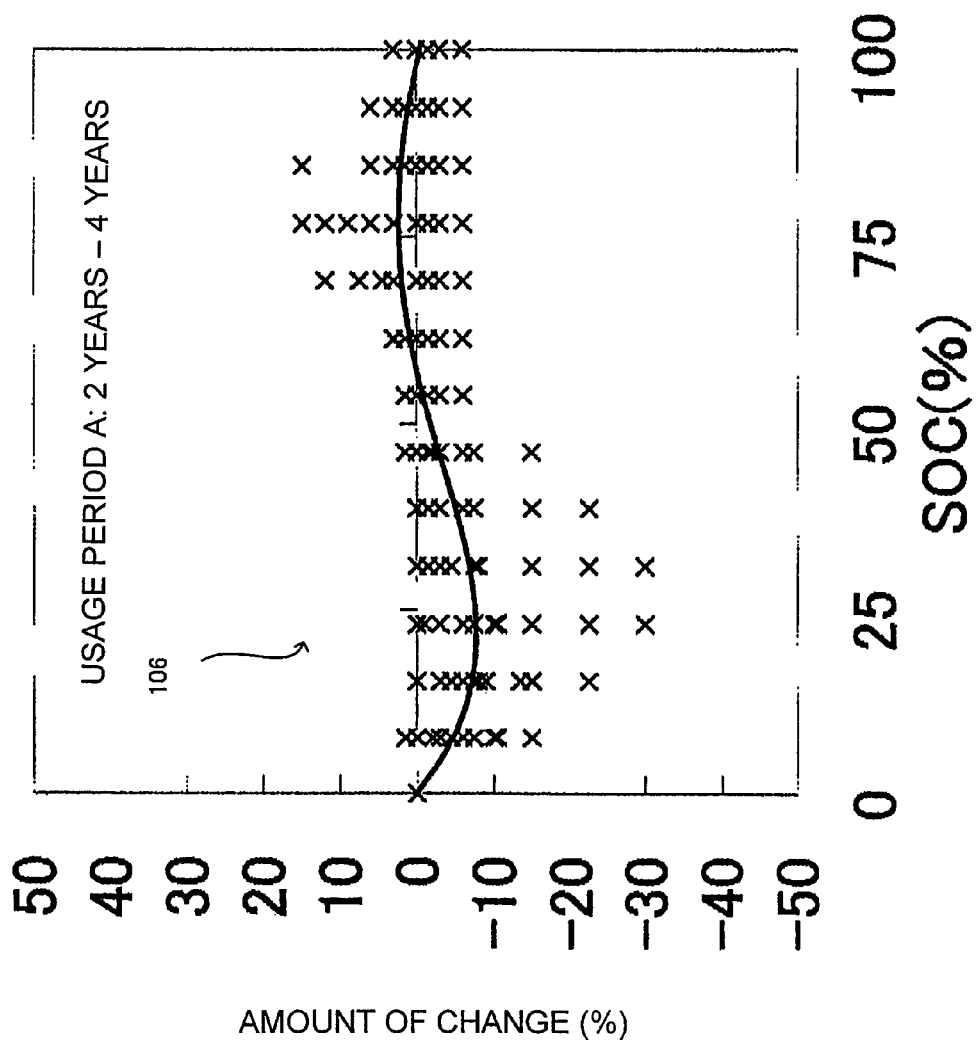
FIG. 22 is a detailed graph (usage period) of FIG. 14.
Figure 23:
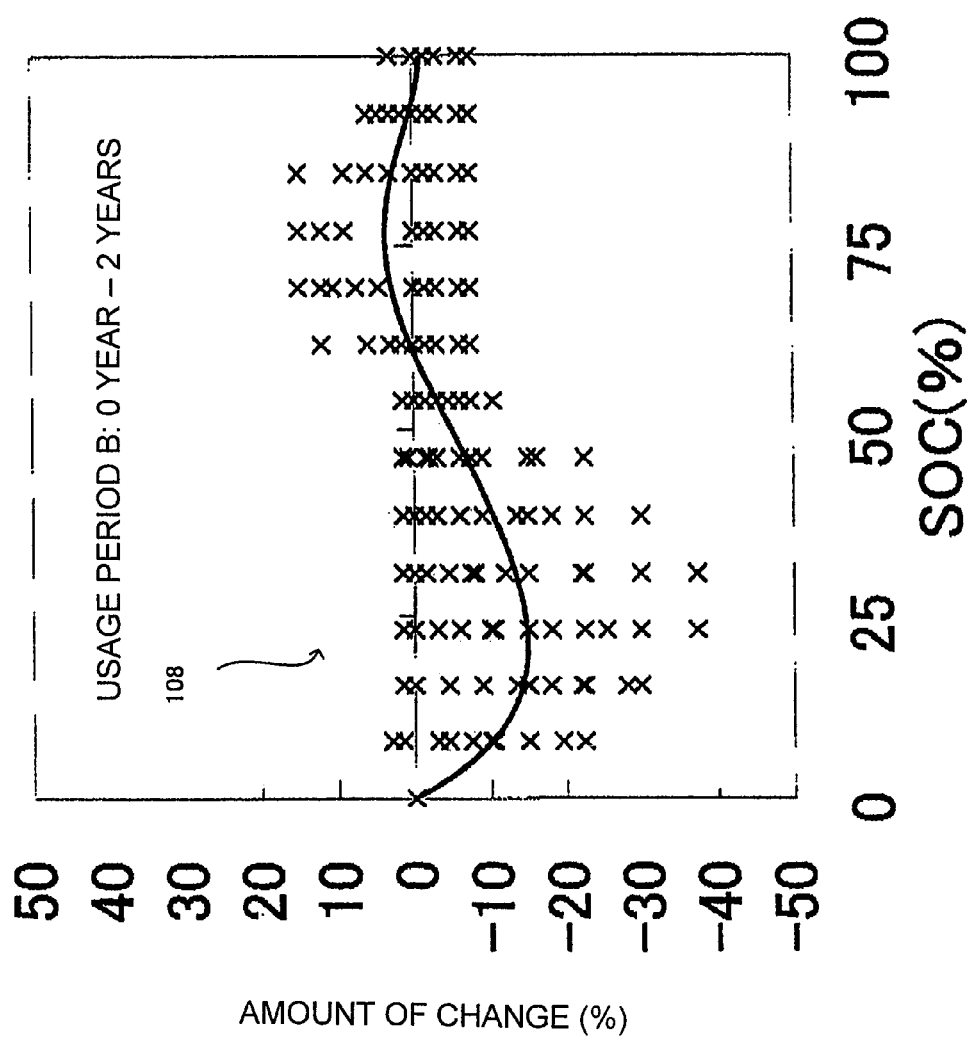
FIG. 23 is a detailed graph (usage period) of FIG. 14.
Figure 24:
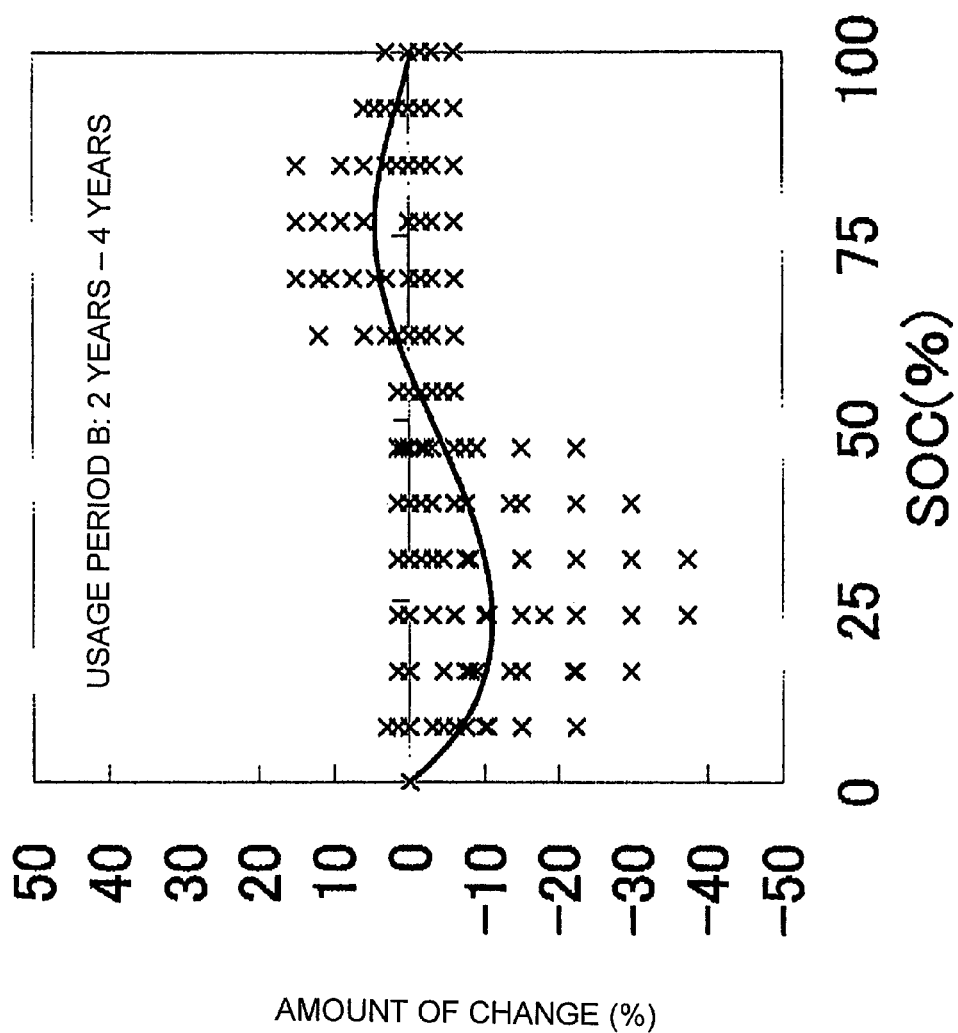
FIG. 24 is a detailed graph (usage period) of FIG. 14.
Figure 25:
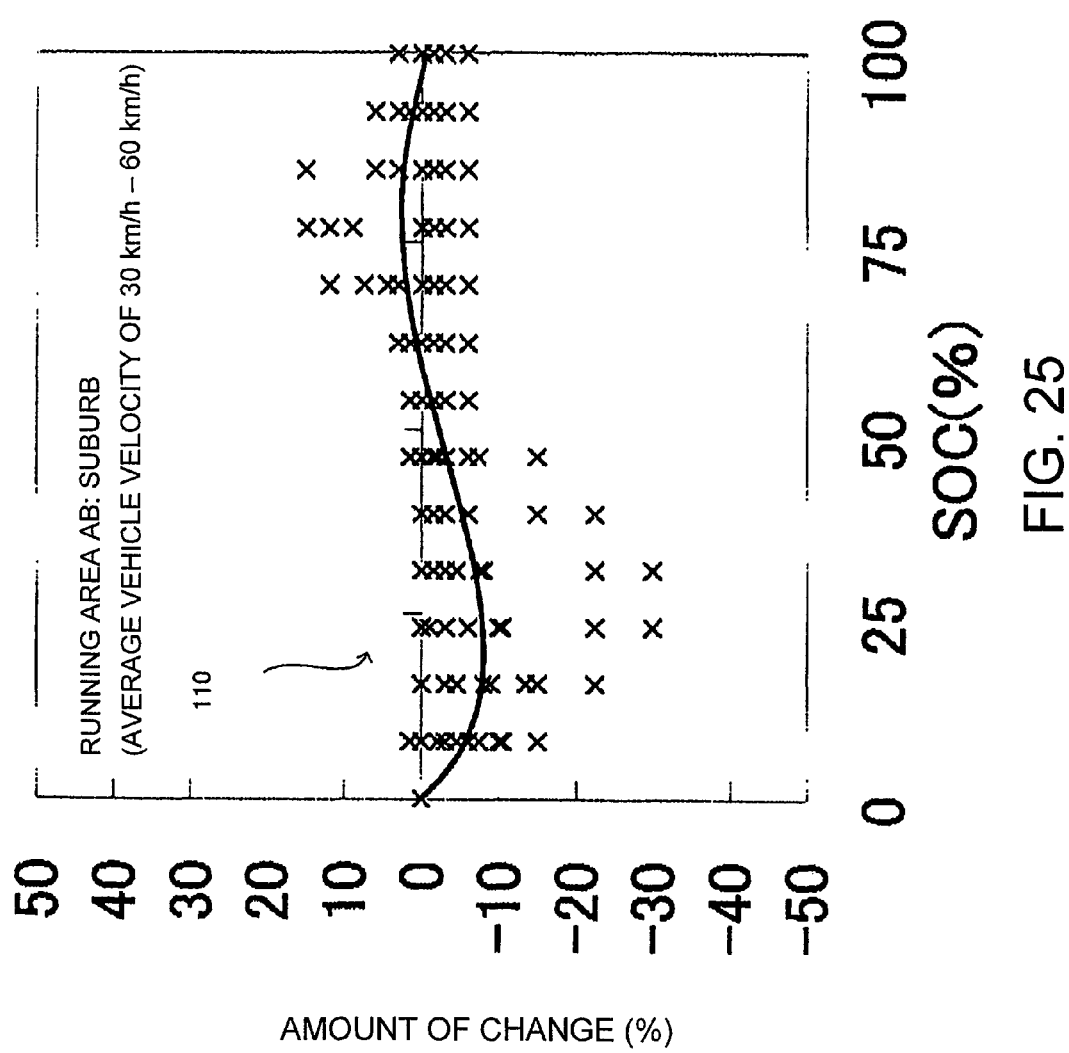
FIG. 25 is a detailed graph (running area) of FIG. 14.
Figure 26:
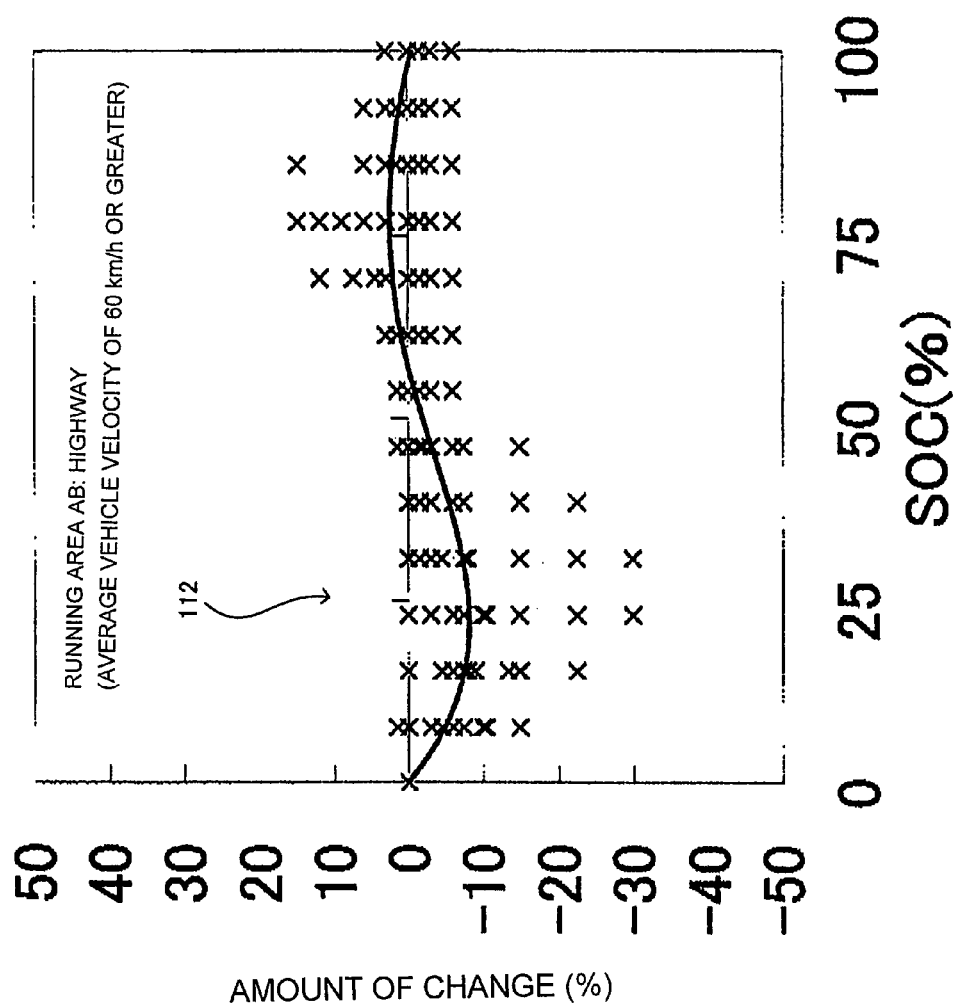
FIG. 26 is a detailed graph (running area) of FIG. 14.

FIG. 14 schematically shows the database of the amount of change of the OCV. FIGS. 18-26 show details of the graphs in the database. FIGS. 18-20 are graphs for different categories of the running distance, FIGS. 21-24 are graphs for different categories of the usage period, and FIGS. 25-26 are graphs for different categories of the running area. The database is categorized to the amount of change of the OCV for each category of the running distance, the amount of change of the OCV for each category of the usage period, and the amount of change of the OCV for each category of the running area. The amount of change of OCV is obtained by a statistical process (for example, an averaging process) on amounts of change of the OCV extracted from a plurality of vehicles. For example, the amounts of change of the OCV for different running distances are categorized into a running distance of 0 km~50000 km, a running distance of 50000 km~100000 km, and a running distance of 100000 km~150000 km, and the amount of change of the OCV in the running distance of 0 km~50000 km is stored as a map 100, and the amount of change of the OCV at the running distance of 50000 km~100000 km is stored as a map 102. FIGS. 15-17 show a calculation method of the graph 100.

First, in FIG. 15, a two-dimensional map of OCV-SOC in the initial state (broken line in FIG. 15) and a two-dimensional map of OCV-SOC after aging degradation after the vehicle has run a certain running distance in a range of 0 km~50000 km (solid line in FIG. 15) are shown. An amount of change of OCV, $\Delta OCV$, is calculated by $\Delta OCV=(OCV$ after the aging degradation$-OCV$ in the initial state). FIG. 16 shows the amount of change of OCV, $\Delta OCV$, calculated in this manner for a plurality of vehicles a, b, and c. All of the plurality of vehicles a, b, and c have the running distance within the range of 0 km~50000 km. FIG. 17 shows a map 100 of $\Delta OCV$ obtained by statistically processing (for example, obtaining an average for each SOC) $\Delta OCV$ of the plurality of vehicles a, b, and c. The map 100 shown in FIG. 14 is calculated in this manner. The map 102 in FIG. 14 is also calculated in a similar manner. The map 102 of FIG. 14, however, is calculated based on the data of a plurality of vehicles having the running distance in a range of 50000 km~100000 km.

With reference again to FIG. 14, for each category of the running distance, the amounts of change of the OCV for each usage period are stored as a map. For example, the category of the usage period is categorized into a usage period of 0 year~2 years, a usage period of 2 years~4 years, etc., and the amount of change of the OCV is stored in each category as a map. Each map is calculated by statistically processing data of a plurality of vehicles corresponding to the condition. For example, a map 104 is calculated by statistically processing data of a plurality of vehicles having a running distance of 0 km~50000 km, and a usage period of 0 year~2 years. A map 106 is calculated by statistically processing data of a plurality of vehicles having a running distance of 0 km~50000 km and a usage period of 2 years~4 years. A map 108 is calculated by statistically processing data of a plurality of vehicles having a running distance of 50000 km~100000 km and a usage period of 0 year~2 years.

The database further stores, for each category of the usage period, the amount of change of the OCV for each category of running area, as a map. For example, the category of the running area is categorized into suburb, highway, etc., and the amount of change of the OCV is stored for each category as a map. Each map is calculated by statistically processing data of a plurality of vehicles corresponding to the condition. For example, a map 110 is calculated by statistically processing data of a plurality of vehicles having a running distance of 0 km~50000 km, a usage period of 2 years~4 years, and a running area of suburb (average vehicle velocity of about 30 km/h~60 km/h). A map 112 is calculated by statistically processing data of a plurality of vehicles having a running distance of 0 km~50000 km, a usage period of 2 years~4 years, and a running area of highway (average vehicle velocity of greater than or equal to 60 km/h).

If the vehicle for which the two-dimensional map is to be corrected has a running distance of 0 km~50000 km, a usage period of 2 years~4 years, and a running area of highway, the map 112 is extracted from the database, and the two-dimensional map is corrected using the map 112. In other words, $\Delta OCV$ defined in the map 112 is added to the map in the initial state for each SOC, to correct the map.

In the database of FIG. 14, in addition to the running distance, the usage period, and the running area, other conditions may also be considered. Examples of such conditions include, for example, usage environments such as temperature, humidity, and climate, which determines the battery temperature (tropical zone, arid zone, cool temperature zone, frigid zone, mountains, and high mountains), and data obtained by storing and calculating information in an ECU such as a total amount of electric charge/discharge, amount of electric charge/discharge for each distance or each period, an amount of change of the SOC, current, battery temperature, and internal resistance, and a frequency distribution.

Alternatively, the map may be corrected using an average running frequency. The average running frequency is defined as the average running frequency=(running distance/usage period). The correction of the map is basically executed at the timing when the vehicle is put into the repair facility or the dealer. Even if the vehicle is not put into the repair facility or the dealer, the map can be automatically corrected at an arbitrary timing if the average running frequency is known. More specifically, when the average running frequency is 5000 km/year and the map is corrected at a certain timing, a controller equipped in the vehicle (ECU) assumes that, one year later, the running distance would be increased by 5000 km in the same running area, and automatically corrects the map at the time one year later. The $\Delta OCV$ which is used in this process may be obtained or downloaded from the dealer in advance or may be obtained by processing $\Delta OCV$ which is used for the previous correction.

In addition, in the present embodiment, the two-dimensional map is corrected for each of a plurality of blocks of the secondary battery 10; that is, each block has a correction history. Therefore, when the secondary battery 10 is disassembled and re-assembled for reuse, the correction history of each block may be referred to, and the blocks having similar correction history; that is, blocks having similar two-dimensional maps, can be collected for the re-assembly, to re-construct the secondary battery 10 with blocks of matching characteristics. In this manner, when the blocks having similar two-dimensional maps are collected for re-assembly of the secondary battery 10, the two-dimensional map for each block may be stored in the storage unit 6 in advance, or a two-dimensional map obtained by statistically processing the two-dimensional maps of all blocks (for example, an average value or a middle value) may be stored as a two-dimensional map common to all blocks.

In the present embodiment, the pair data of the voltage and the current are measured for each battery block which is a part of the secondary battery 10 and the two-dimensional map is corrected for each block. Alternatively, the voltage and the current may be measured for each battery module which is a part of the battery block, and the two-dimensional map may be corrected for each battery module. In this case, the two-dimensional map is corrected for each battery module and stored in the storage unit 6. Alternatively, the two-dimensional map of the secondary battery may be corrected with a representative two-dimensional map obtained by statistically processing the two-dimensional map for each battery block or the two-dimensional map for each battery module (for example, an average value or a middle value).

In the present embodiment, the two-dimensional map in the initial state stored in the storage unit 6 is corrected (updated) by the above-described method at the repair facility or the dealer of the vehicle. More specifically, the judging unit 7 of the battery ECU 1 may receive input of a new two-dimensional map (statistical two-dimensional map) supplied from the outside and store the same in the storage unit 6, to correct the two-dimensional map. In other words, the judging unit 7 can function as a unit which corrects the two-dimensional map. The judging unit 7, the DCIR and OCV calculating unit 8, and the SOC calculating unit 14 are formed with a microcomputer.

In the present embedment, the two-dimensional map (or table) in the initial state is a two-dimensional map (or table) which defines the relationship between the no-load voltage OCV and the SOC. Alternatively, it is also possible to use the electromotive force in place of the no-load voltage. It is known that there is a certain relationship between the electromotive force of the secondary battery and the SOC, and the electromotive force can be calculated based on the no-load voltage and a polarization voltage. That is, the electromotive force can be obtained by subtracting the polarization voltage from the no-load voltage. The polarization voltage in the running state of the hybrid electric vehicle is calculated from an amount of change of an integrated capacity in a predetermined period, and the integrated capacity in the predetermined period can be obtained by integrating the current of the secondary battery in the predetermined period. A two-dimensional map of the electromotive force-SOC is stored in the storage unit 6 of the battery ECU 1 in place of the two-dimensional map of OCV-SOC, and the two-dimensional map is referred to so that the SOC corresponding to the calculated electromotive force is read and the SOC is estimated. Alternatively, in addition to the SOC being calculating in this manner, the current SOC may be estimated based on an SOC which is previously calculated and a change capacity, and the current SOC may be calculated based on the two SOC values including the SOC calculated from the two-dimensional map and the SOC calculated from the change capacity.

In the case where the map of electromotive force-SOC is also used as the two-dimensional map, similar to the case where the map of OCV-SOC is used, the relationship between the electromotive force and the SOC changes due to degradation. Therefore, similar to the case where the two-dimensional map of OCV-SOC is used, the two-dimensional map of the electromotive force-SOC is corrected. More specifically, in the process flowchart of FIG. 10, the DCIR and OCV calculating unit 8 calculates the internal resistance DCIR in S101, the internal resistance DCIR is compared in size with the predefined upper limit value and the predefined lower limit value for provisional judgment in S102, and, when it is judged in S103 that the secondary battery is degraded, the two-dimensional map of the electromotive force-SOC in the initial state stored in the storage unit 6 is corrected in S104 using statistical data obtained from two-dimensional maps of electromotive force-SOC of a plurality of vehicles.

Similar to the correction of the two-dimensional map of OCV-SOC in the initial state, the correction of the two-dimensional map of the electromotive force-SOC is also executed at a repair facility, a dealer, etc. of the vehicle. In the process flowchart of FIG. 11, similar to the correction of the two-dimensional map of OCV-SOC, after the current capacity of the secondary battery is checked, the secondary battery 10 is charged/discharged with a predefined charging/discharging pattern in S202. The predefined charging/discharging pattern may be, for example, a pattern in which the secondary battery is charged to an SOC of 80%, and left for a predetermined time period. Then, under a constant temperature environment of 25° C., 5 cycles of a charging/discharging cycle in which "the battery is discharged for 5 seconds with a predetermined constant current value, left for a predetermined time period (a predetermined value of greater than or equal to 10 minutes), charged for 5 seconds with a predetermined constant current value, and left for a predetermined time period (a predetermined time value of greater than or equal to 10 minutes)" are executed. Then, similar to the two-dimensional map of OCV-SOC, measured values at a plurality of constant current values and SOCs are obtained, and the electromotive force is calculated by a V intercept where the current is zero in the graph in which the current value is plotted on the horizontal axis and the terminal voltage is plotted on the vertical axis. In addition, the internal resistance DCIR is calculated from the slope of the approximated straight line. Unlike the case where the two-dimensional map of OCV-SOC is calculated, because a sufficiently long leaving time period is provided after each of the charging and discharging processes, states can be obtained in which the polarization voltage is almost completely attenuated. Therefore, the V intercept when the current is zero can be taken as the electromotive force. In this manner, a two-dimensional map of electromotive force-SOC reflecting the current state of the secondary battery is calculated. Then, an amount of change from the initial value is calculated in S204, a correction value corresponding to the amount of change is obtained from the database in S205, and the map of electromotive force-SOC is corrected in S206. The amount of change of the current electromotive force with respect to the initial value can be calculated for any SOC of the map, and, for example, the amount of change of the electromotive force at an SOC of 50% is calculated.

A control device of secondary battery has been described which is used for the hybrid electric vehicle in which the direction and the current of the charging/discharging are frequently switched. In the case of the usage in which the fluctuation in current for charging/discharging is relatively small, for example, in the case of an electric vehicle and a battery-driven electric train, the secondary battery may be controlled using the two-dimensional map of terminal voltage-SOC which defines a relationship between the terminal voltage of the secondary battery and the SOC in place of the two-dimensional map of OCV-SOC or the two-dimensional map of electromotive force-SOC. In this case also, the flowchart of FIG. 11 may be applied. In S103 of FIG. 10, the degradation is provisionally judged (S102) based on the internal resistance calculation of DCIR (S101). When it is provisionally judged that the secondary battery has degraded, the two-dimensional map of terminal voltage-SOC is corrected in S104. Unlike the predefined charging/discharging pattern used in the correction of the two-dimensional map of OCV-SOC or the two-dimensional map of electromotive force-SOC, after the current capacity of the secondary battery is checked, for example, charging and discharging of 1 cycle is executed between predetermined SOCs with a constant current of 0.3C. The terminal voltage at each SOC is obtained, and the two-dimensional map of terminal voltage-SOC reflecting the current state of the secondary battery is calculated.

When the two-dimensional map is to be corrected in the repair facility or dealer, it can be checked which of the two-dimensional maps of terminal voltage-SOC, no-load voltage-SOC, and electromotive force-SOC is stored in the storage unit 6 of the battery ECU 1, and one of the terminal voltage, no-load voltage, and electromotive force is detected or calculated based on the type of the map, to correct the two-dimensional map. Although the terminal voltage, no-load voltage, and electromotive force are physical quantities which differ from each other, each of these quantities represents a physical quantity representing the voltage state of the secondary battery, and these quantities may be generally defined as a voltage index representing the voltage state of the secondary battery. Thus, the process may be considered as correcting the map (or table) which defines a relationship between the voltage index and the SOC based on data obtained not only from the secondary battery, but also by statistically processing a plurality of maps (or tables) corresponding to an amount of change of the voltage index, among a plurality of maps (or tables) obtained from secondary batteries equipped as a plurality of other electric power supply sources. The amount of change of the voltage index from the initial state can be calculated for all SOCs of the map, and, for example, the correction may be executed based on the amount of change of the voltage index at an SOC of 50%.

The map (table) in the initial state in the present embodiment is not limited to a map (table) which is introduced at first to the ECU 1 at the design of the secondary battery, and the present embodiment can be similarly applied to a case where a corrected map (table) is introduced.

In addition, although in the present embodiment an example configuration is shown in which the degradation is provisionally judged based on a value of the internal resistance DCIR during running of the vehicle, the present invention is not limited to such a configuration, and the provisional judgment may alternatively be executed at the repair facility, the dealer, etc. In addition, the provisional judgment of the degradation during the running of the vehicle may be omitted, and the map may be corrected at the repair facility, dealer, etc.

Moreover, although the present embodiment shows an example configuration of the predefined charging/discharging pattern which is used for correcting the map in the repair facility, dealer, etc., the present invention is not limited to such a method. However, the charging/discharging is preferably approximately equal to the charging/discharging pattern when the map in the initial state is produced.

What is claimed is:

1. A control device for a secondary battery, comprising:
a unit which obtains a voltage index of a secondary battery which is equipped as an electric power supply source;
a storage unit which stores in advance a relationship between the voltage index and an SOC of the secondary battery;
a unit which obtains a relationship between the voltage index and the SOC reflecting a current state of the secondary battery; and
a correcting unit which corrects the relationship based on an amount of change of the obtained voltage index from an initial state, the correcting unit correcting the relationship stored in the storing unit using not only data obtained from the secondary battery, but also data obtained by statistically processing a plurality of the relationships corresponding to the amount of change among a plurality of the relationships obtained from a plurality of other secondary batteries equipped as electric power supply sources.

2. The control device for secondary battery according to claim 1, further comprising:
a unit which provisionally judges degradation of the secondary battery based on an internal resistance calculated from a plurality of sets of pair data consisting of a current and a voltage.

3. The control device for secondary battery according to claim 1, wherein
the correcting unit corrects the relationship stored in the storage unit when the calculated amount of change of the voltage index from the initial state falls outside a predefined range.

4. The control device for secondary battery according to claim 1, wherein
the secondary battery is equipped on a vehicle, and
the correcting unit corrects the relationship stored in the storage unit using data obtained by statistically processing a plurality of the relationships corresponding to the amount of change and a running distance of the vehicle.

5. The control device for secondary battery according to claim 1, wherein
the correcting unit corrects the relationship stored in the storage unit using data obtained by statistically processing a plurality of the relationships corresponding to the amount of change and a usage period of the secondary battery from the initial state.

6. The control device for secondary battery according to claim 1, wherein
the secondary battery is equipped on a vehicle, and
the correcting unit corrects the relationship stored in the storage unit using data obtained by statistically processing a plurality of the relationships corresponding to the amount of change and a running area of the vehicle.

7. The control device for secondary battery according to claim 1, wherein
the secondary battery comprises a plurality of blocks;
the storage unit stores in advance a common relationship for all blocks as the relationship; and
the correcting unit corrects, for each block, the common relationship for all blocks.

8. The control device for secondary battery according to claim 1, wherein
the secondary battery comprises a plurality of battery modules comprising one or a plurality of cells;
the storage unit stores in advance a common relationship for all battery modules as the relationship; and
the correcting unit corrects, for each battery module, the common relationship for all battery modules.

9. The control device for secondary battery according to claim 1, wherein
the voltage index is an electromotive force obtained by subtracting a polarization voltage from a no-load voltage which is a voltage intercept when a current is zero in an approximated straight line obtained by statistically processing pair data consisting of a terminal voltage and a current of the secondary battery.

10. The control device for secondary battery according to claim 1, wherein
the voltage index is a no-load voltage which is a voltage intercept when a current is zero in an approximated straight line obtained by statistically processing pair data consisting of a terminal voltage and a current of the secondary battery.

11. The control device for secondary battery according to claim 1, wherein
the voltage index is a terminal voltage of the secondary battery.

12. A control device for a secondary battery, comprising:
a unit which obtains a voltage index of a secondary battery which is equipped on a vehicle;
a storage unit which stores in advance a relationship between the voltage index and an SOC of the secondary battery;
a unit which obtains a relationship between the voltage index and the SOC reflecting a current state of the secondary battery; and
a correcting unit which corrects the relationship stored in the storage unit using corresponding data, for each category of running distance, among data obtained by statistically processing a relationship between an amount of change of the voltage index from an initial state and the SOC.

13. The control device for secondary battery according to claim 12, wherein
the correcting unit corrects the relationship stored in the storage unit further using corresponding data, for each category of a usage period, among data obtained by statistically processing a relationship between the amount of change and the SOC.

14. The control device for secondary battery according to claim 13, wherein
the correcting unit corrects the relationship stored in the storage unit further using corresponding data, for each category of a running area, among data obtained by statistically processing a relationship between the amount of change and the SOC.

15. A method of correcting a map which defines a relationship between a voltage index and an SOC of a secondary battery which is stored in advance in a storage unit for calculating the SOC of the secondary battery, the method comprising:
obtaining the voltage index by charging/discharging the secondary battery according to a predetermined pattern;

judging whether or not an amount of change of the obtained voltage index from an initial state falls within a predefined range; and correcting, when the amount of change falls outside the predefined range, the relationship stored in the storage unit using not only data obtained from the secondary battery, but also data obtained by statistically processing a plurality of the relationships corresponding to the amount of change among a plurality of the relationships obtained from a plurality of other secondary batteries.

16. The method according to claim 15, wherein
the voltage index is an electromotive force obtained by subtracting a polarization voltage from a no-load voltage which is a voltage intercept when a current is zero in an approximated straight line obtained by statistically processing pair data consisting of a terminal voltage and a current of the secondary battery.

17. The method according to claim 15, wherein
the voltage index is a no-load voltage which is a voltage intercept when a current is zero in an approximated straight line obtained by statistically processing pair data consisting of a terminal voltage and a current of the secondary battery.

18. The method according to claim 15, wherein
the voltage index is a terminal voltage of the secondary battery.

* * * * *